(12) United States Patent
Zimmerman

(10) Patent No.: US 9,134,620 B2
(45) Date of Patent: Sep. 15, 2015

(54) DOUBLE EUV ILLUMINATION UNIFORMITY CORRECTION SYSTEM AND METHOD

(75) Inventor: Richard Carl Zimmerman, Brookfield, CT (US)

(73) Assignee: ASML Holding N.V., Velhoven (NL)

( * ) Notice: Subject to any disclaimer, the term of this patent is extended or adjusted under 35 U.S.C. 154(b) by 492 days.

(21) Appl. No.: 13/445,242

(22) Filed: Apr. 12, 2012

(65) Prior Publication Data

US 2012/0262685 A1 Oct. 18, 2012

Related U.S. Application Data

(60) Provisional application No. 61/475,156, filed on Apr. 13, 2011.

(51) Int. Cl.
  *G03B 27/68* (2006.01)
  *G03B 27/42* (2006.01)
  *G03F 7/20* (2006.01)

(52) U.S. Cl.
  CPC ........ *G03F 7/70075* (2013.01); *G03F 7/70083* (2013.01); *G03F 7/70191* (2013.01)

(58) Field of Classification Search
  CPC G03F 7/70558; G03F 7/7075; G03F 7/70083
  USPC .............. 355/52, 53, 67–71; 250/492.2
  See application file for complete search history.

(56) References Cited

U.S. PATENT DOCUMENTS

| | | | |
|---|---|---|---|
| 6,013,401 A * | 1/2000 | McCullough et al. ......... 430/30 |
| 6,455,862 B1 | 9/2002 | van der Veen et al. |
| 6,771,352 B2 | 8/2004 | Dierichs |
| 7,532,308 B2 | 5/2009 | Bouman |
| 7,674,643 B2 | 3/2010 | Lee et al. |
| 7,697,116 B2 * | 4/2010 | Dierichs et al. ................. 355/71 |
| 7,864,297 B2 * | 1/2011 | Kawahara ....................... 355/71 |
| 7,889,320 B2 | 2/2011 | Ohya et al. |
| 8,629,973 B2 * | 1/2014 | Zimmerman et al. .......... 355/71 |
| 2006/0126036 A1 | 6/2006 | Kremer et al. |
| 2007/0014112 A1 | 1/2007 | Ohya et al. |
| 2007/0268473 A1 | 11/2007 | Kawahara |
| 2008/0239258 A1 | 10/2008 | Hult |

(Continued)

FOREIGN PATENT DOCUMENTS

| CN | 1445613 A | 10/2003 |
|---|---|---|
| CN | 101221373 A | 7/2008 |

(Continued)

*Primary Examiner* — Hung Henry Nguyen

(74) *Attorney, Agent, or Firm* — Sterne, Kessler, Goldstein & Fox P.L.L.C.

(57) ABSTRACT

A lithographic apparatus includes a uniformity correction system located at a plane and configured to receive a substantially constant pupil when illuminated with the beam of radiation. The uniformity correction system includes fingers that move into and out of intersection with a beam so as to correct an intensity of respective portions of the radiation beam. According to another embodiment, a method includes for: focusing a beam of radiation at a first plane to form pupil; adjusting the intensity of the beam near the first plane by moving fingers located near the first plane into and out of a path of the beam of radiation, wherein a width of a tip of each of the fingers is larger than that of corresponding actuating devices used to move each corresponding one of the fingers; patterning the beam; and projecting the patterned beam onto a substrate.

18 Claims, 16 Drawing Sheets

(56) References Cited

U.S. PATENT DOCUMENTS

| | | |
|---|---|---|
| 2009/0073404 A1 | 3/2009 | Muramatsu |
| 2009/0135394 A1* | 5/2009 | Van Greevenbroek ......... 355/67 |
| 2010/0253926 A1 | 10/2010 | Endres et al. |
| 2010/0302525 A1 | 12/2010 | Zimmerman et al. |
| 2011/0096317 A1 | 4/2011 | Stuetzle et al. |

FOREIGN PATENT DOCUMENTS

| | | | |
|---|---|---|---|
| JP | 2002-232049 A | 8/2000 | |
| JP | 2000-315648 A | 11/2000 | |
| JP | 2006-134932 A | 5/2006 | |
| JP | 2006-253186 A | 9/2006 | |
| JP | 2007-207821 A | 8/2007 | |
| JP | 2010-098336 A | 4/2010 | |
| JP | 2011-228556 A | 11/2011 | |
| WO | WO 2005/048326 A1 | 5/2005 | |
| WO | WO 2007/145139 A1 | 12/2007 | |

* cited by examiner

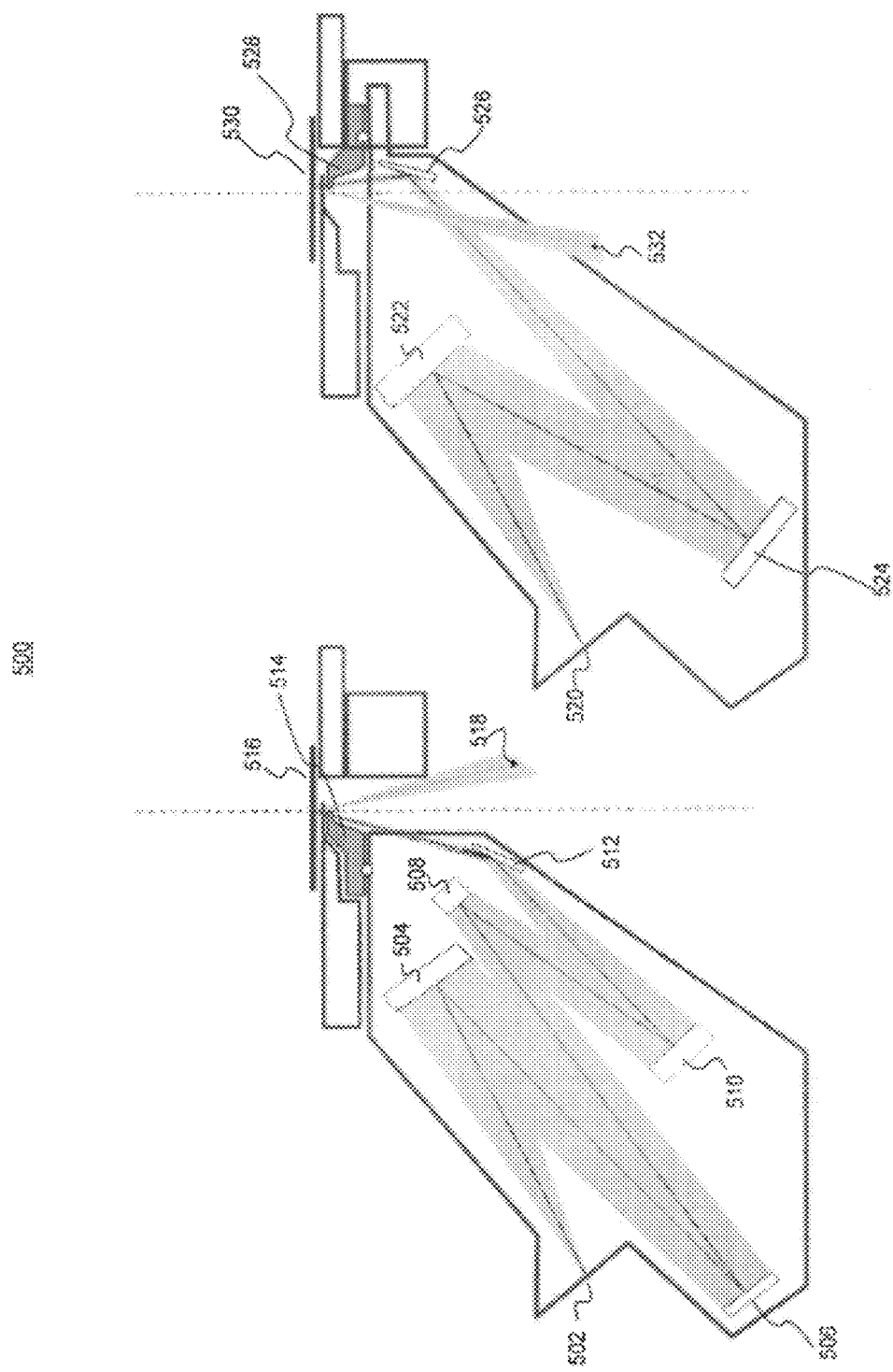

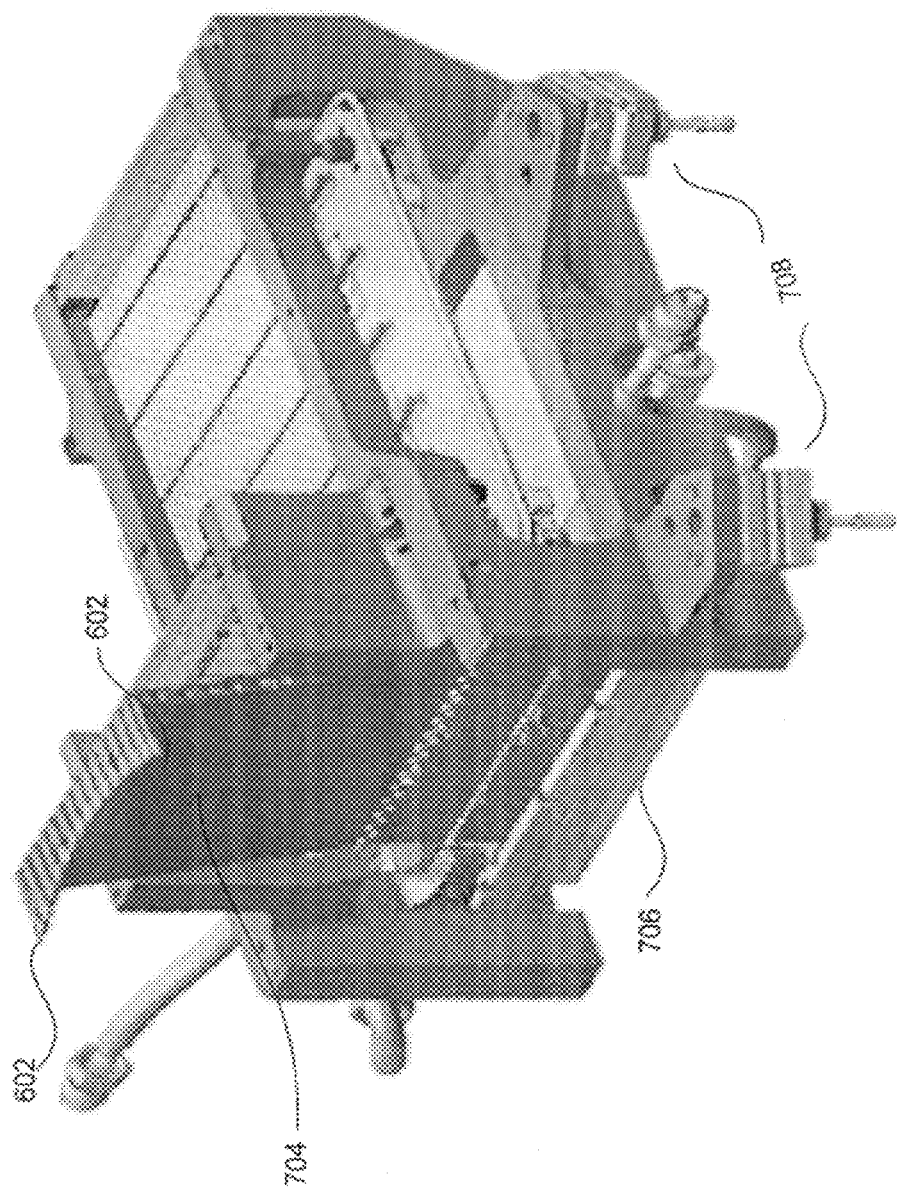

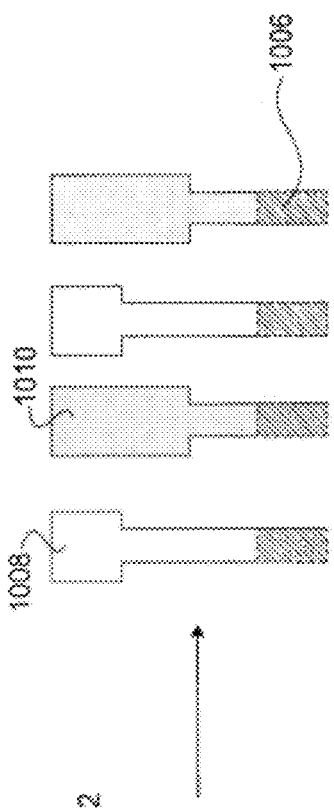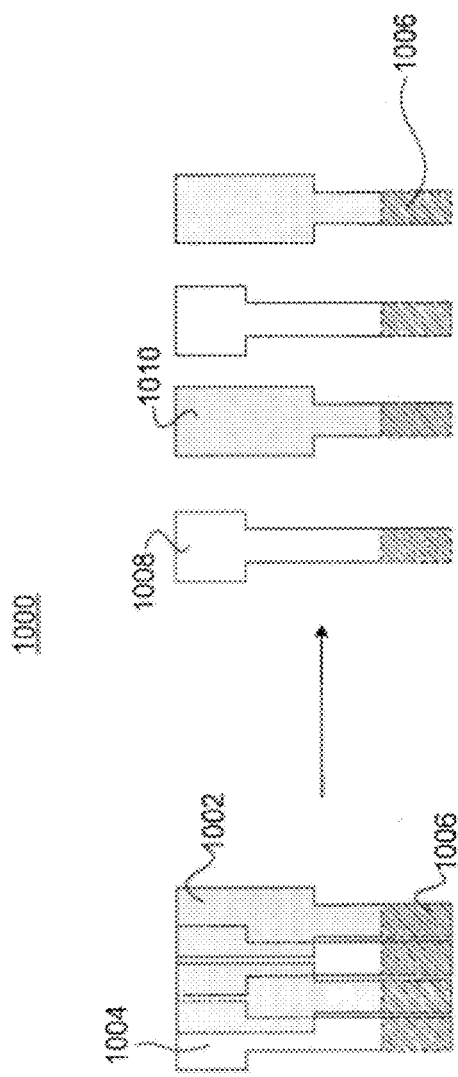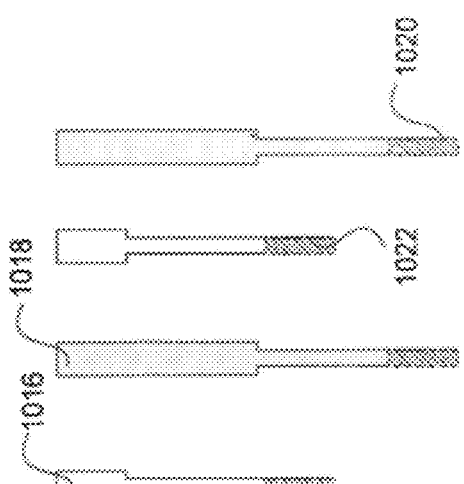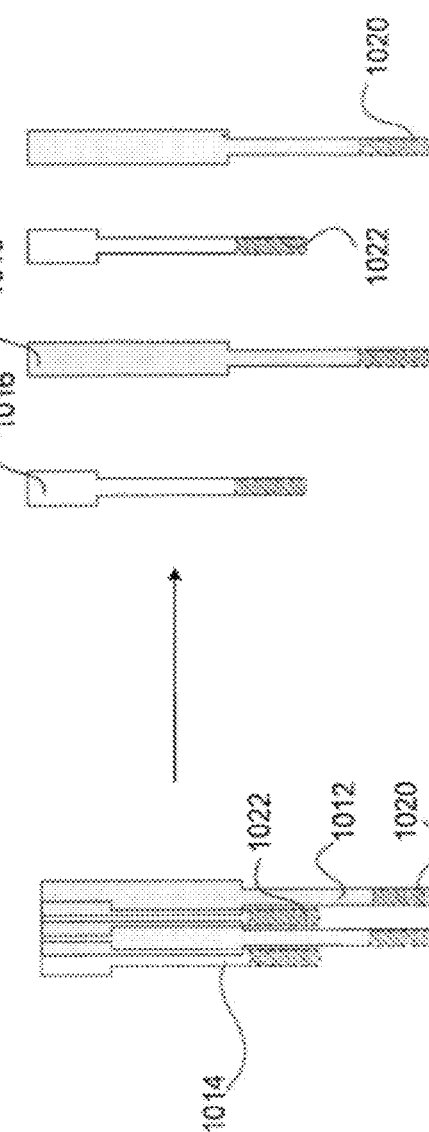

DOUBLE EUV ILLUMINATION UNIFORMITY CORRECTION SYSTEM AND METHOD

CROSS REFERENCE TO RELATED APPLICATIONS

This application claims the benefit under 35 U.S.C. 119(e) to U.S. Provisional Application 61/475,156, filed Apr. 13, 2011, which is incorporated by reference herein in its entirety.

FIELD OF THE INVENTION

The present invention relates to a lithographic apparatus and illumination uniformity correction system. The present invention generally relates to lithography, and more particularly to a system and method for compensating for uniformity drift caused by, for example, illumination beam movement, optical column uniformity, uniformity compensator drift, etc.

BACKGROUND

A lithographic apparatus is a machine that applies a desired pattern onto a target portion of a substrate. The lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g., comprising part of, one or several dies) on a substrate (e.g., a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti parallel to this direction.

A lithographic apparatus typically includes an illumination system, which is arranged to condition radiation generated by a radiation source before the radiation is incident upon a patterning device. The illumination system may, for example, modify one or more properties of the radiation, such as polarization and/or illumination mode. The illumination system may include a uniformity correction system, which is arranged to correct or reduce non-uniformities, e.g., intensity non-uniformities, present in the radiation. The uniformity correction devices may employ actuated fingers which are inserted into an edge of a radiation beam to correct intensity variations. However, a width of a spatial period of intensity variation in that can be corrected is dependent on a size of an actuating device used to move fingers of the uniformity correction system. Furthermore, in some instances, if a size or shape of the fingers used to correct irregularities of a radiation beam is modified, then the uniformity correction system may compromise or modify in an unwanted manner one or more properties of the radiation beam, such as a pupil formed by the radiation beam.

Lithography is widely recognized as a key process in manufacturing integrated circuits (ICs) as well as other devices and/or structures. A lithographic apparatus is a machine, used during lithography, which applies a desired pattern onto a substrate, such as onto a target portion of the substrate. During manufacture of ICs with a lithographic apparatus, a patterning device (which is alternatively referred to as a mask or a reticle) generates a circuit pattern to be formed on an individual layer in an IC. This pattern may be transferred onto the target portion (e.g., comprising part of, one, or several dies) on the substrate (e.g., a silicon substrate). Transfer of the pattern is typically via imaging onto a layer of radiation-sensitive material (e.g., resist) provided on the substrate. In general, a single substrate contains a network of adjacent target portions that are successively patterned. To reduce manufacturing cost of ICs, it is customary to expose multiple substrates of each IC. Likewise, it is also customary that the lithographic apparatus is in almost constant use. That is, in order to keep manufacturing cost of all types of ICs at a potential minimum, the idle time between substrate exposures is also minimized. Thus, the lithographic apparatus absorbs heat which causes expansion of the apparatus's components leading to drift, movement, and uniformity changes.

In order to ensure good imaging quality on the patterning device and the substrate, a controlled uniformity of the illumination beam is maintained. That is, the illumination beam before reflecting off of or transmitting through the patterning device potentially has a non-uniform intensity profile. It is desirable to the entire lithographic process that the illumination beam be controlled with at least some uniformity. Uniformity can refer to a constant intensity across the entire illumination beam, but can also refer to the ability to control the illumination to a target illumination. The target illumination uniformity has a flat or a non-flat profile. The patterning device imparts to a beam of radiation a pattern, which is then imaged onto a substrate. Image quality of this projected radiation beam is affected by the uniformity of the illumination beam.

The market demands that the lithographic apparatus perform the lithography process as efficiently as possible to maximize manufacturing capacity and keep costs per device low. This means keeping manufacturing defects to a minimum, which is why the effect of the uniformity of the illumination beam needs to be minimized as much as practical.

SUMMARY

It is desirable to provide a lithographic apparatus and method that overcome or mitigate one or more problems, whether identified herein or elsewhere.

According to an embodiment of the present invention, there is provided a lithographic apparatus comprising an illumination system configured to condition a beam of radiation. The illumination system comprises a uniformity correction system located at a plane configured to receive a substantially constant pupil when illuminated with the beam of radiation. The uniformity correction system includes fingers configured to be movable into and out of intersection with a radiation beam so as to correct an intensity of respective portions of the radiation beam and actuating devices coupled to corresponding ones of the fingers and configured to move the corresponding fingers.

According to an embodiment of the invention, a width of a tip of each of the fingers is larger than that of a width of an actuating device configured to move the tip.

In one example, the lithography apparatus further includes a support structure, a substrate table, and a projection system. The support device is configured to hold a patterning device configured to impart the conditioned beam of radiation with a pattern in its cross-section. The substrate table is configured to hold a substrate. The projection system is configured to project the patterned radiation beam onto a target portion of the substrate.

According to another embodiment of the invention, there is provided a method of lithography comprising the following steps: (1) focusing a beam of radiation at a first plane so as to form a substantially constant pupil at the first plane, (2) adjusting the intensity of the beam of radiation near the first plane by moving fingers located near the first plane into and out of a path of the beam of radiation, wherein a width of a tip of each of the fingers is larger than that of corresponding actuating devices used to move each corresponding one of the fingers, (3) directing the beam of radiation beam onto a patterning device to pattern the beam of radiation, and (4) projecting the patterned radiation beam onto a substrate.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

FIGS. 1A and 1B respectively depict reflective and transmissive lithographic apparatuses with uniformity compensators and associated sensors.

FIGS. 5A and 5B illustrate example reflective lithography systems containing uniformity compensators.

FIG. 7 is a three-dimensional model of an example uniformity compensator.

FIGS. 10A-10D illustrates overlapping fingers of example uniformity compensation systems.

Figure 1A:
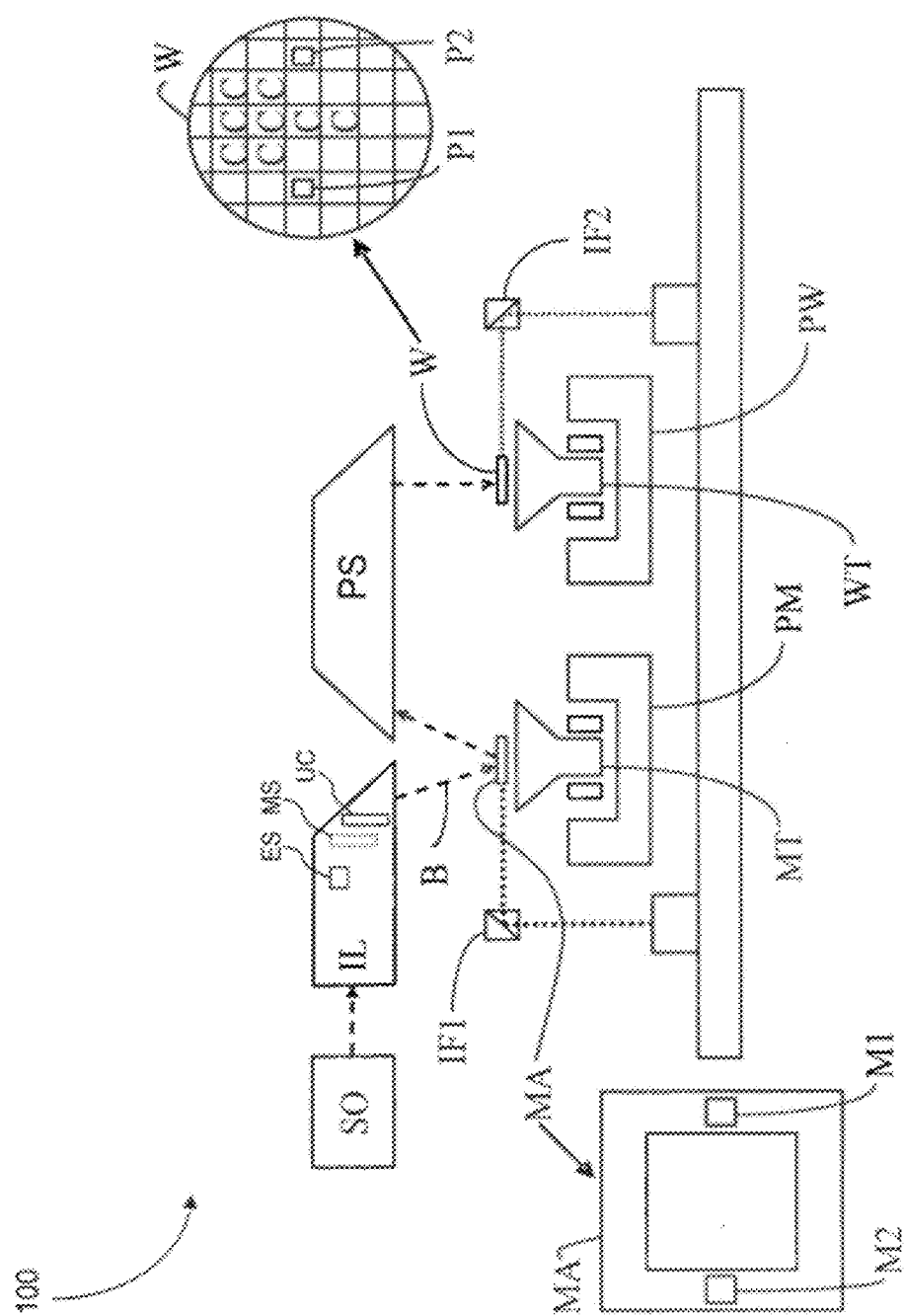

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

The present invention is directed to methods using uniformity compensators to compensate for uniformity drift caused by, for example, illumination beam movement, optical column uniformity, uniformity compensator drift, etc. This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Before describing such embodiments in more detail, however, it is instructive to present an example environment in which embodiments of the present invention may be implemented.

I. An Example Lithographic Environment

A. Example Reflective and Transmissive Lithographic Systems

Figure 1B:
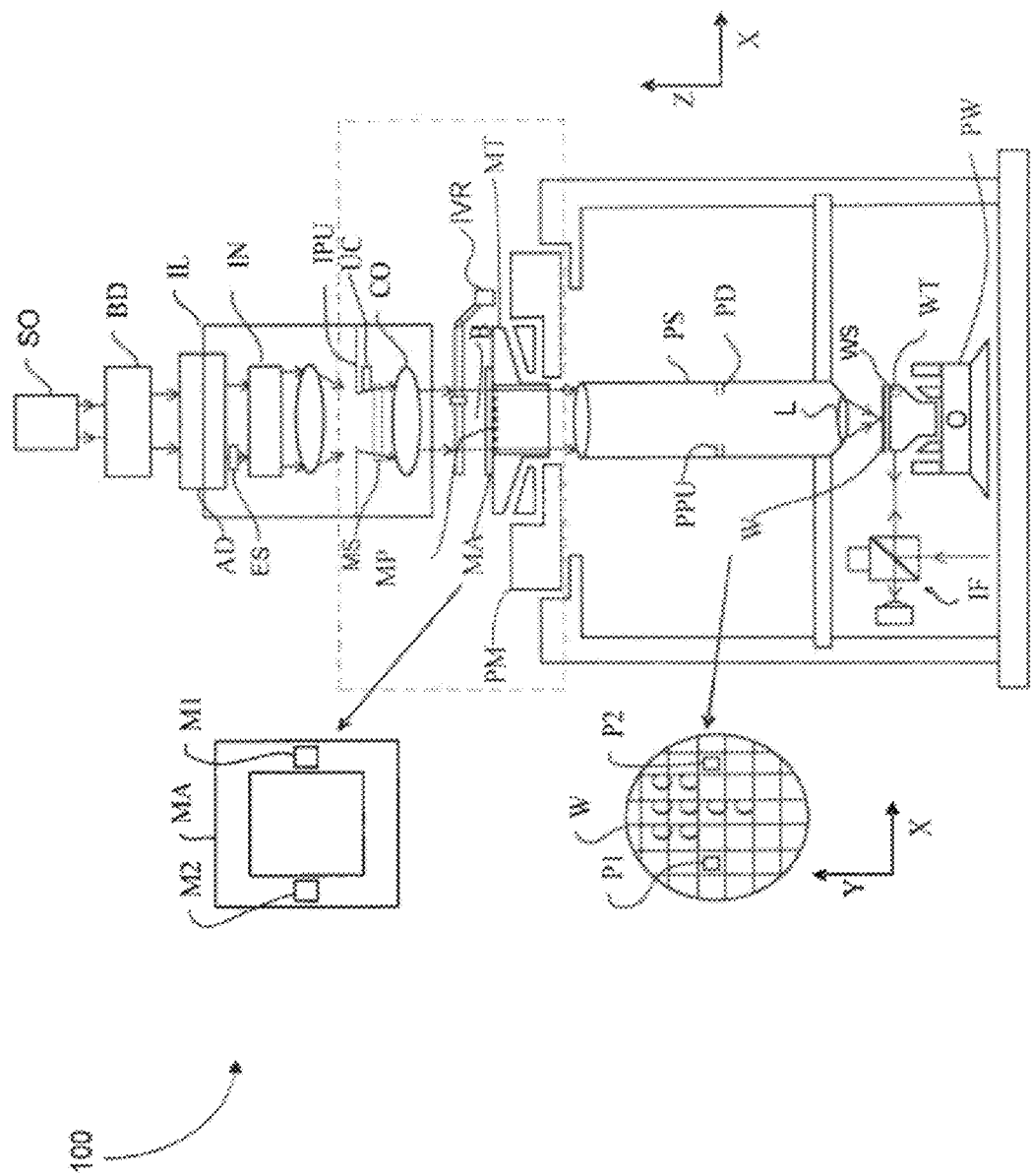

FIGS. 1A and 1B schematically depict lithographic apparatus 100 and lithographic apparatus 100', respectively. Lithographic apparatus 100 and lithographic apparatus 100' each include: an illumination system (illuminator) IL configured to condition a radiation beam B (e.g., DUV or EUV radiation); a support structure (e.g., a mask table) MT configured to support a patterning device (e.g., a mask, a reticle, or a dynamic patterning device) MA and connected to a first positioner PM configured to accurately position the patterning device MA; and a substrate table (e.g., a substrate table) WT configured to hold a substrate (e.g., a resist coated substrate) W and connected to a second positioner PW configured to accurately position the substrate W. Lithographic apparatuses 100 and 100' also have a projection system PS configured to project a pattern imparted to the radiation beam B by patterning device MA onto a target portion (e.g., comprising one or more dies) C of the substrate W. In lithographic apparatus 100 the patterning device MA and the projection system PS is reflective, and in lithographic apparatus 100' the patterning device MA and the projection system PS is transmissive.

The illumination system IL may include various types of optical components, such as refractive, reflective, magnetic, electromagnetic, electrostatic, or other types of optical components, or any combination thereof, for directing, shaping, or controlling the radiation B. The illumination system IL may also include an energy sensor ES that provides a measurement of the energy (per pulse), a measurement sensor MS for measuring the movement of the optical beam, and uniformity compensators UC that allow the illumination slit uniformity to be controlled.

The support structure MT holds the patterning device MA in a manner that depends on the orientation of the patterning device MA, the design of the lithographic apparatuses 100 and 100', and other conditions, such as for example whether or not the patterning device MA is held in a vacuum environment. The support structure MT may use mechanical, vacuum, electrostatic, or other clamping techniques to hold the patterning device MA. The support structure MT may be a frame or a table, for example, which may be fixed or movable, as required. The support structure MT may ensure that the patterning device is at a desired position, for example with respect to the projection system PS.

The term "patterning device" MA should be broadly interpreted as referring to any device that may be used to impart a radiation beam B with a pattern in its cross-section, such as to create a pattern in the target portion C of the substrate W. The pattern imparted to the radiation beam B may correspond to a particular functional layer in a device being created in the target portion C, such as an integrated circuit.

The patterning device MA may be transmissive (as in lithographic apparatus 100' of FIG. 1B) or reflective (as in lithographic apparatus 100 of FIG. 1A). Examples of patterning devices MA include reticles, masks, programmable mirror arrays, and programmable LCD panels. Masks are well known in lithography, and include mask types such as binary, alternating phase shift, and attenuated phase shift, as well as various hybrid mask types. An example of a programmable mirror array employs a matrix arrangement of small mirrors, each of which may be individually tilted so as to reflect an incoming radiation beam in different directions. The tilted mirrors impart a pattern in the radiation beam B which is reflected by the mirror matrix.

The term "projection system" PS may encompass any type of projection system, including refractive, reflective, catadioptric, magnetic, electromagnetic and electrostatic optical systems, or any combination thereof, as appropriate for the exposure radiation being used, or for other factors, such as the use of an immersion liquid or the use of a vacuum. A vacuum environment may be used for EUV or electron beam radiation since other gases may absorb too much radiation or electrons. A vacuum environment may therefore be provided to the whole beam path with the aid of a vacuum wall and vacuum pumps.

Lithographic apparatus 100 and/or lithographic apparatus 100' may be of a type having two (dual stage) or more substrate tables (and/or two or more mask tables) WT. In such "multiple stage" machines the additional substrate tables WT may be used in parallel, or preparatory steps may be carried out on one or more tables while one or more other substrate tables WT are being used for exposure.

Referring to FIGS. 1A and 1B, the illuminator IL receives a radiation beam from a radiation source SO. The source SO and the lithographic apparatuses 100, 100' may be separate entities, for example when the source SO is an excimer laser. In such cases, the source SO is not considered to form part of the lithographic apparatuses 100 or 100', and the radiation beam B passes from the source SO to the illuminator IL with the aid of a beam delivery system BD (FIG. 1B) comprising, for example, suitable directing mirrors and/or a beam expander. In other cases, the source SO may be an integral part of the lithographic apparatuses 100, 100' for example when the source SO is a mercury lamp. The source SO and the illuminator IL, together with the beam delivery system BD, if required, may be referred to as a radiation system.

The illuminator IL may comprise an adjuster AD (FIG. 1B) for adjusting the angular intensity distribution of the radiation beam. Generally, at least the outer and/or inner radial extent (commonly referred to as σ-outer and σ-inner, respectively) of the intensity distribution in a pupil plane of the illuminator may be adjusted. In addition, the illuminator IL may comprise various other components (FIG. 1B), such as an integrator IN and a condenser CO. The illuminator IL may be used to condition the radiation beam B, to have a desired uniformity and intensity distribution in its cross section. This desired uniformity is may be maintained through the use of the energy sensors ES that divides-out the variation of the source output and the uniformity compensator UC that is comprised of a plurality of protrusions (e.g., fingers) that can be inserted into and removed from the illumination beam to modify its uniformity and intensity.

Referring to FIG. 1A, the radiation beam B is incident on the patterning device (e.g., mask) MA, which is held on the support structure (e.g., mask table) MT, and is patterned by the patterning device MA. In lithographic apparatus 100, the radiation beam B is reflected from the patterning device (e.g., mask) MA. After being reflected from the patterning device (e.g., mask) MA, the radiation beam B passes through the projection system PS, which focuses the radiation beam B onto a target portion C of the substrate W. With the aid of the second positioner PW and position sensor IF2 (e.g., an interferometric device, linear encoder, or capacitive sensor), the substrate table WT may be moved accurately, e.g. so as to position different target portions C in the path of the radiation beam B. Similarly, the first positioner PM and another position sensor IF1 may be used to accurately position the patterning device (e.g., mask) MA with respect to the path of the radiation beam B. Patterning device (e.g., mask) MA and substrate W may be aligned using mask alignment marks M1, M2 and substrate alignment marks P1, P2.

Referring to FIG. 1B, the radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g., an interferometric device, linear encoder, or capacitive sensor), the substrate table WT can be moved accurately, e.g. so as to position different target portions C in the path of the radiation beam B. Similarly, the first positioner PM and another position sensor (which is not explicitly depicted in FIG. 1B) can be used to accurately position the mask MA with respect to the path of the radiation beam B, e.g., after mechanical retrieval from a mask library, or during a scan. Likewise, in FIG. 2 there is a substrate stage slit sensor WS that on a per pulse basis in conjunction with the energy sensor ES produces normalized intensity data from the illumination system IL to the substrate W.

In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (known as scribe-lane alignment marks). Similarly, in situations in which more than one die is provided on the mask MA, the mask alignment marks may be located between the dies.

The lithographic apparatuses 100 and 100' may be used in at least one of the following modes:

1. In step mode, the support structure (e.g., mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C may be exposed.

2. In scan mode, the support structure (e.g., mask table) MT and the substrate table WT are scanned synchronously while a pattern imparted to the radiation beam B is projected onto a target portion C (i.e., a single dynamic exposure). The velocity and direction of the substrate table WT relative to the support structure (e.g., mask table) MT may be determined by the (de-)magnification and image reversal characteristics of the projection system PS.

3. In another mode, the support structure (e.g., mask table) MT is kept substantially stationary holding a programmable patterning device, and the substrate table WT is moved or scanned while a pattern imparted to the radiation beam B is projected onto a target portion C. A pulsed radiation source SO may be employed and the programmable patterning device is updated as required after each movement of the substrate table WT or in between successive radiation pulses during a scan. This mode of operation may be readily applied to maskless lithography that utilizes programmable patterning device, such as a programmable mirror array of a type as referred to herein.

Combinations and/or variations on the described modes of use or entirely different modes of use may also be employed.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "substrate" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

In a further embodiment, lithographic apparatus 100 includes an extreme ultraviolet (EUV) source, which is configured to generate a beam of EUV radiation for EUV lithography. In general, the EUV source is configured in a radiation system (see below), and a corresponding illumination system is configured to condition the EUV radiation beam of the EUV source.

B. Example EUV Lithographic Apparatus

Figure 2:
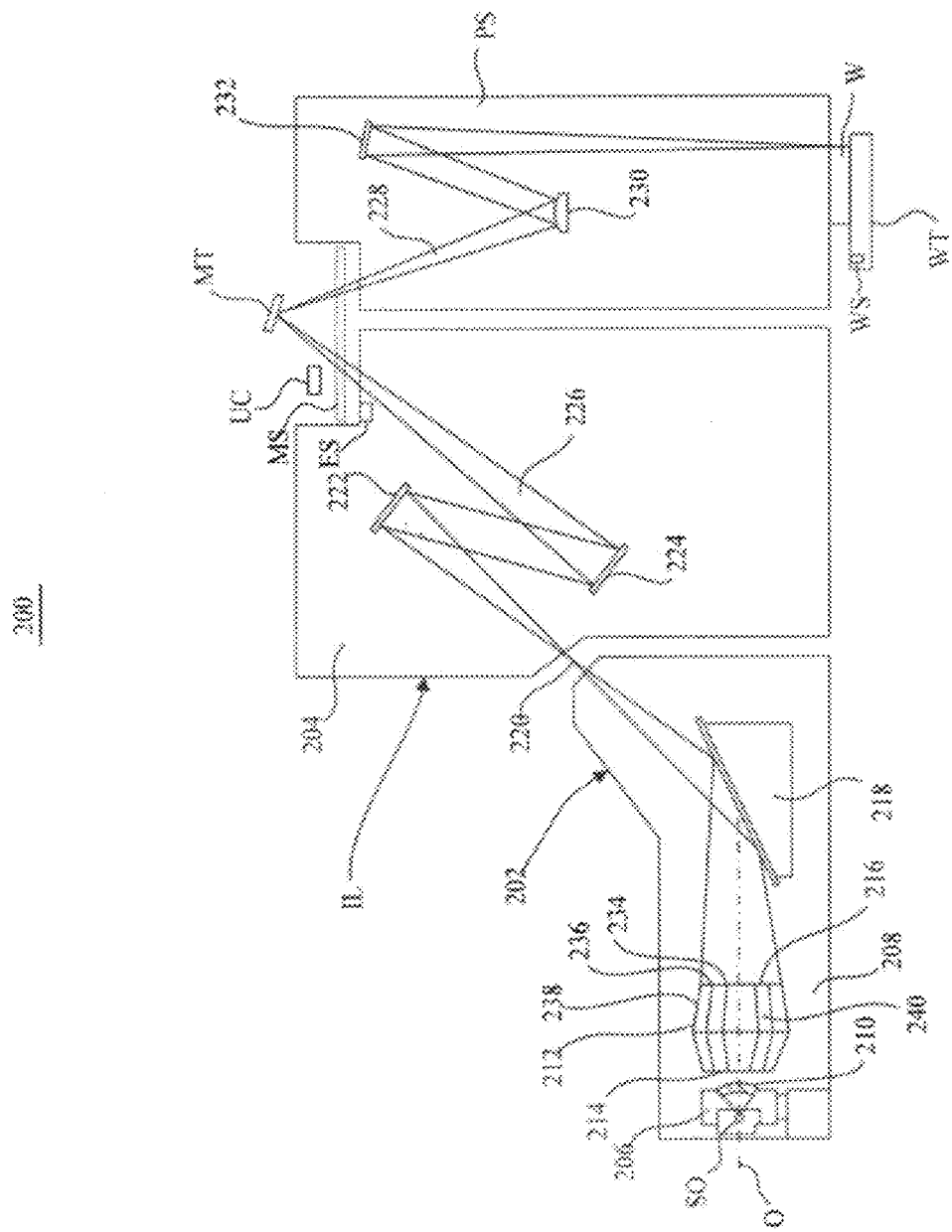
FIG. 2 depicts an example extreme ultra violet (EUV) lithographic apparatus.

FIG. 2 schematically depicts an exemplary EUV lithographic apparatus according to an embodiment of the present invention. In FIG. 2, EUV lithographic apparatus includes a radiation system 202, an illumination optics unit 204, and a projection system PS. The radiation system 202 includes a radiation source SO, in which a beam of radiation may be formed by a discharge plasma. In an embodiment, EUV radiation may be produced by a gas or vapor, for example, from Xe gas, Li vapor, or Sn vapor, in which a very hot plasma is created to emit radiation in the EUV range of the electromagnetic spectrum. The very hot plasma can be created by generating at least partially ionized plasma by, for example, an electrical discharge. Partial pressures of, for example, 10 Pa of Xe, Li, Sn vapor or any other suitable gas or vapor may be required for efficient generation of the radiation. The radiation emitted by radiation source SO is passed from a source chamber 206 into a collector chamber 208 via a gas barrier or contaminant trap 210 positioned in or behind an opening in source chamber 206. In an embodiment, gas barrier 210 may include a channel structure.

Collector chamber 208 includes a radiation collector 212 (which may also be called collector mirror or collector) that may be formed from a grazing incidence collector. Radiation collector 212 has an upstream radiation collector side 214 and a downstream radiation collector side 216, and radiation passed by collector 212 can be reflected off a grating spectral filter 218 to be focused at a virtual source point 220 at an aperture in the collector chamber 208. Radiation collectors 212 are known to skilled artisans.

From collector chamber 208, a beam of radiation 226 is reflected in illumination optics unit 204 via normal incidence reflectors 222 and 224 onto a reticle or mask (not shown) positioned on reticle or mask table MT. A patterned beam 228 is formed, which is imaged in projection system PS via reflective elements 230 and 232 onto a substrate (not shown) supported on substrate stage or substrate table WT. In various embodiments, illumination optics unit 204 and projection system PS may include more (or fewer) elements than depicted in FIG. 2. For example, illumination optics unit 204 may also include an energy sensor ES that provides a measurement of the energy (per pulse), a measurement sensor MS for measuring the movement of the optical beam, and uniformity compensators UC that allow the illumination slit uniformity to be controlled. Additionally, grating spectral filter 218 may optionally be present, depending upon the type of lithographic apparatus. Further, in an embodiment, illumination optics unit 204 and projection system PS may include more mirrors than those depicted in FIG. 2. For example, projection system PS may incorporate one to four reflective elements in addition to reflective elements 230 and 232. In FIG. 2, reference number 240 indicates a space between two reflectors, e.g., a space between reflectors 234 and 236.

In an embodiment, collector mirror 212 may also include a normal incidence collector in place of or in addition to a grazing incidence mirror. Further, collector mirror 212, although described in reference to a nested collector with reflectors 234, 236, and 238, is herein further used as example of a collector.

Further, instead of a grating 218, as schematically depicted in FIG. 2, a transmissive optical filter may also be applied. Optical filters transmissive for EUV, as well as optical filters less transmissive for or even substantially absorbing UV radiation, are known to skilled artisans. Hence, the use of "grating spectral purity filter" is herein further indicated interchangeably as a "spectral purity filter," which includes gratings or transmissive filters. Although not depicted in FIG. 2, EUV transmissive optical filters may be included as additional optical elements, for example, configured upstream of collector mirror 212 or optical EUV transmissive filters in illumination unit 204 and/or projection system PS.

The terms "upstream" and "downstream," with respect to optical elements, indicate positions of one or more optical elements "optically upstream" and "optically downstream," respectively, of one or more additional optical elements. Following the light path that a beam of radiation traverses through lithographic apparatus, a first optical elements closer to source SO than a second optical element is configured upstream of the second optical element; the second optical element is configured downstream of the first optical element. For example, collector mirror 212 is configured upstream of spectral filter 218, whereas optical element 222 is configured downstream of spectral filter 218.

All optical elements depicted in FIG. 2 (and additional optical elements not shown in the schematic drawing of this embodiment) may be vulnerable to deposition of contaminants produced by source SO, for example, Sn. Such may be the case for the radiation collector 212 and, if present, the spectral purity filter 218. Hence, a cleaning device may be employed to clean one or more of these optical elements, as well as a cleaning method may be applied to those optical elements, but also to normal incidence reflectors 222 and 224 and reflective elements 230 and 232 or other optical elements, for example additional mirrors, gratings, etc.

Radiation collector 212 can be a grazing incidence collector, and in such an embodiment, collector 212 is aligned along an optical axis O. The source SO, or an image thereof, may also be located along optical axis O. The radiation collector 212 may comprise reflectors 234, 236, and 238 (also known as a "shell" or a Wolter-type reflector including several Wolter-type reflectors). Reflectors 234, 236, and 238 may be nested and rotationally symmetric about optical axis O. In FIG. 2, an inner reflector is indicated by reference number 234, an intermediate reflector is indicated by reference number 236, and an outer reflector is indicated by reference number 238. The radiation collector 212 encloses a certain volume, e.g., a volume within the outer reflector(s) 238. Usually, the volume within outer reflector(s) 238 is circumferentially closed, although small openings may be present.

Reflectors 234, 236, and 238 respectively may include surfaces of which at least portion represents a reflective layer or a number of reflective layers. Hence, reflectors 234, 236, and 238 (or additional reflectors in the embodiments of radiation collectors having more than three reflectors or shells) are at least partly designed for reflecting and collecting EUV radiation from source SO, and at least part of reflectors 234, 236, and 238 may not be designed to reflect and collect EUV radiation. For example, at least part of the back side of the reflectors may not be designed to reflect and collect EUV radiation. On the surface of these reflective layers, there may in addition be a cap layer for protection or as optical filter provided on at least part of the surface of the reflective layers.

The radiation collector 212 may be placed in the vicinity of the source SO or an image of the source SO. Each reflector 234, 236, and 238 may comprise at least two adjacent reflecting surfaces, the reflecting surfaces further from the source SO being placed at smaller angles to the optical axis O than the reflecting surface that is closer to the source SO. In this way, a grazing incidence collector 212 is configured to generate a beam of EUV radiation propagating along the optical axis O. At least two reflectors may be placed substantially coaxially and extend substantially rotationally symmetric about the optical axis O. It should be appreciated that radiation collector 212 may have further features on the external surface of outer reflector 238 or further features around outer reflector 238, for example a protective holder, a heater, etc.

In the embodiments described herein, the terms "lens" and "lens element," where the context allows, may refer to any one or combination of various types of optical components, comprising refractive, reflective, magnetic, electromagnetic and electrostatic optical components.

Further, the terms "radiation" and "beam" used herein encompass all types of electromagnetic radiation, comprising ultraviolet (UV) radiation (e.g., having a wavelength λ of 365, 248, 193, 157 or 126 nm), extreme ultra-violet (EUV or soft X-ray) radiation (e.g., having a wavelength in the range of 5-20 nm, e.g., 13.5 nm), or hard X-ray working at less than 5 nm, as well as particle beams, such as ion beams or electron beams. Generally, radiation having wavelengths between about 780-3000 nm (or larger) is considered IR radiation. UV refers to radiation with wavelengths of approximately 100-400 nm. Within lithography, it is usually also applied to the wavelengths, which can be produced by a mercury discharge lamp: G-line 436 nm; H-line 405 nm; and/or I-line 365 nm. Vacuum UV, or VUV (i.e., UV absorbed by air), refers to radiation having a wavelength of approximately 100-200 nm. Deep UV (DUV) generally refers to radiation having wavelengths ranging from 126 nm to 428 nm, and in an embodiment, an excimer laser can generate DUV radiation used within lithographic apparatus. It should be appreciated that radiation having a wavelength in the range of, for example, 5-20 nm relates to radiation with a certain wavelength band, of which at least part is in the range of 5-20 nm.

Figure 3:
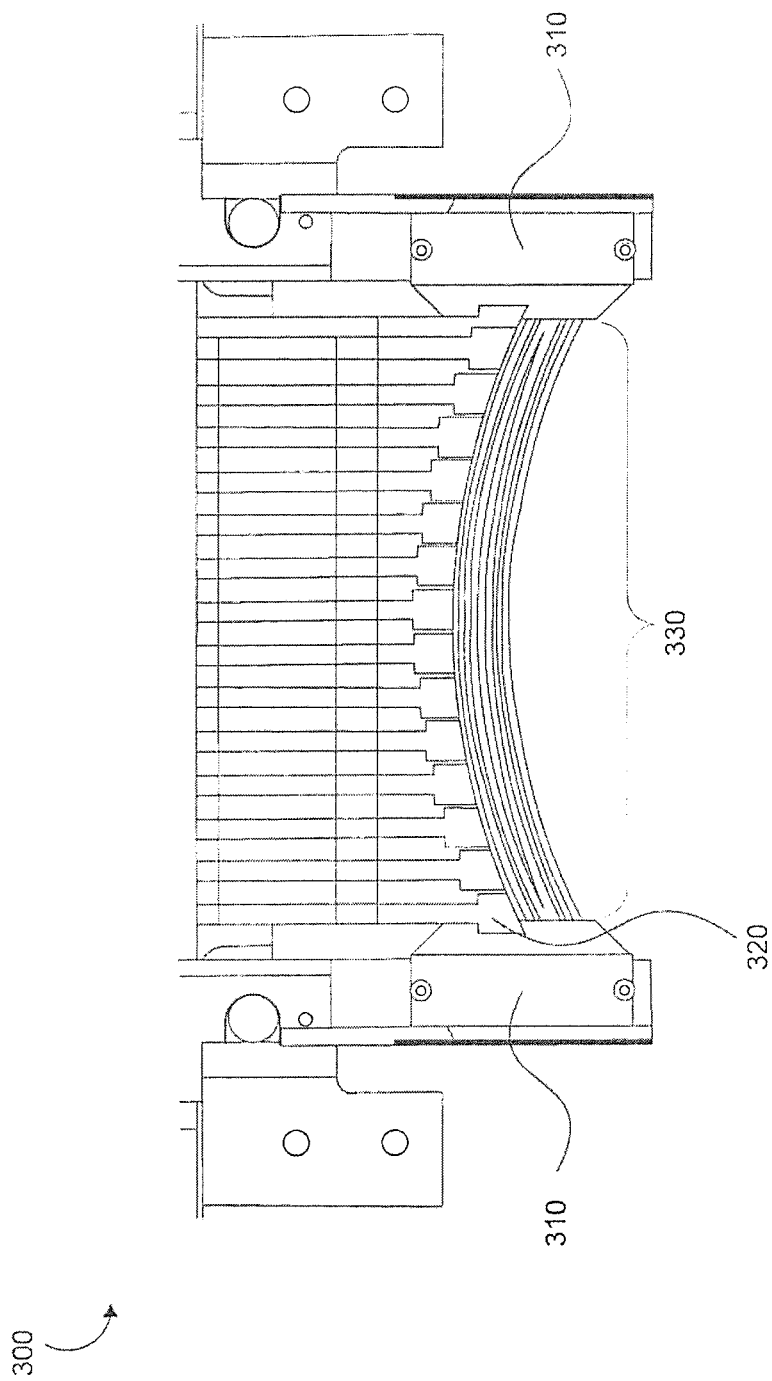
FIG. 3 shows an example of a uniformity compensators with respect to the illumination beam slit.

II. System and Methods for Compensating for Drift in Illumination Beam Uniformity FIG. 3 illustrates a mechanical portion of a uniformity refresh (UR) correction system 300, according to an embodiment of the present invention. In FIG. 3, the uniformity refresh (UR) correction system 300 includes energy sensors (ES) 310 and a plurality of uniformity compensators 320. UR correction system 300 can modify the illumination beam during a lithographic operation. In at least one embodiment of the present invention, the illumination beam is shaped in an arc shape and is referred to as an illumination slit 330. By controlling movement of the individual uniformity compensators 320 into and out of the illumination slit 330, the uniformity of the illumination slit 330 can be controlled. The uniformity compensators 320 may also be referred to as fingers. An example operation of uniformity compensators may be found in commonly owned, co-pending U.S. Non-provisional patent application Ser. No. 12/789,795, filed May 28, 2010, which is incorporated by reference herein in its entirety.

In one example, the fingers shown in FIG. 3 may be individually controlled to modify the intensity of the illumination slit in order to achieve a target uniformity.

Figure 4:
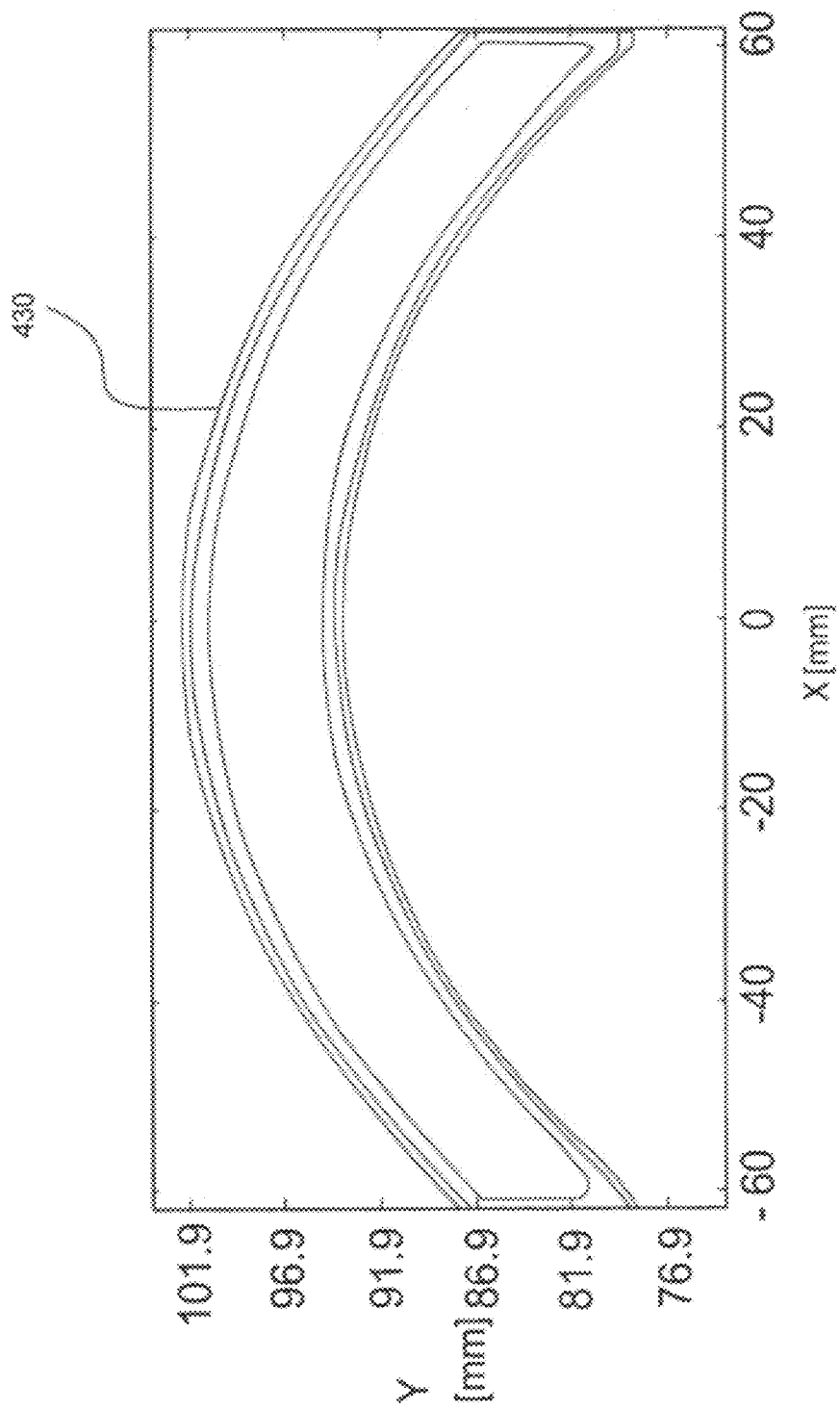
FIG. 4 shows an example of a illumination beam slit.

FIG. 4 is an enlarged view of illumination slit 430, according to one embodiment of the present invention. For example, in at least one embodiment, FIG. 4 illustrates a size and shape of the illumination slit 430. FIG. 4 does not show fingers of the uniformity compensators that are inserted into and withdrawn from the path of the illumination slit in order to modify its intensity uniformity. In one embodiment, the uniformity compensators are only located on one side of the illumination slit.

FIGS. 5A and 5B illustrate example reflective lithography systems containing uniformity compensators 514 and 528 respectively. In the first example, FIG. 5A illustrates an illumination source 502 that provides an illumination beam that reflects off various mirrors 504, 506, 508, 510 and 512. The beam interacts with fingers of a uniformity compensator 514 before hitting the reticle 516. The reticle is reflective. Therefore, the patterned radiation beam 518 is reflected from the reticle 516 as it propagates toward the substrate (not shown).

Another example reflective lithography system that uses a uniformity compensator system 528 is shown in FIG. 5B. An illumination source 520 provides an illumination beam that is reflected from mirrors 522, 524, and 526. The beam interacts with fingers of a uniformity compensator 528 before hitting the reticle 530. The reticle is reflective. Therefore the beam of radiation is patterned by the reticle 530 and is reflected as the patterned beam 532 as it propagates toward the substrate (not shown).

Figure 6B:
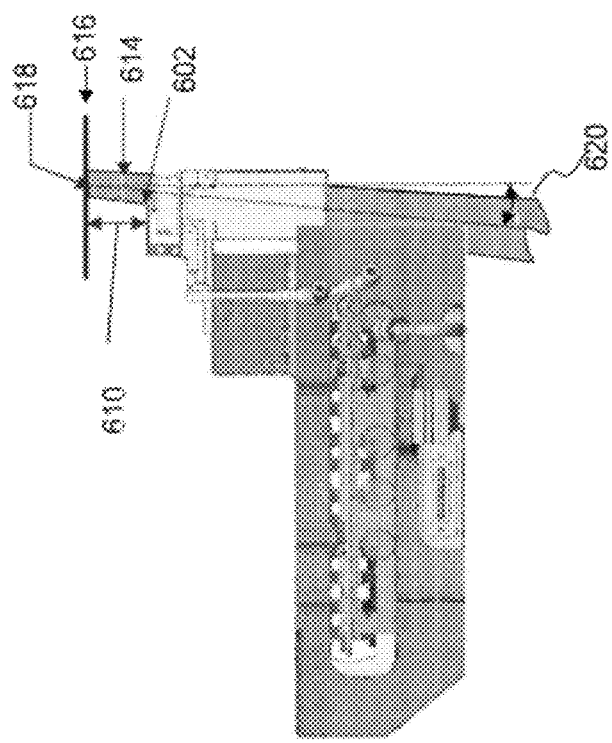
FIGS. 6A and 6B show example uniformity compensators.
Figure 6A:
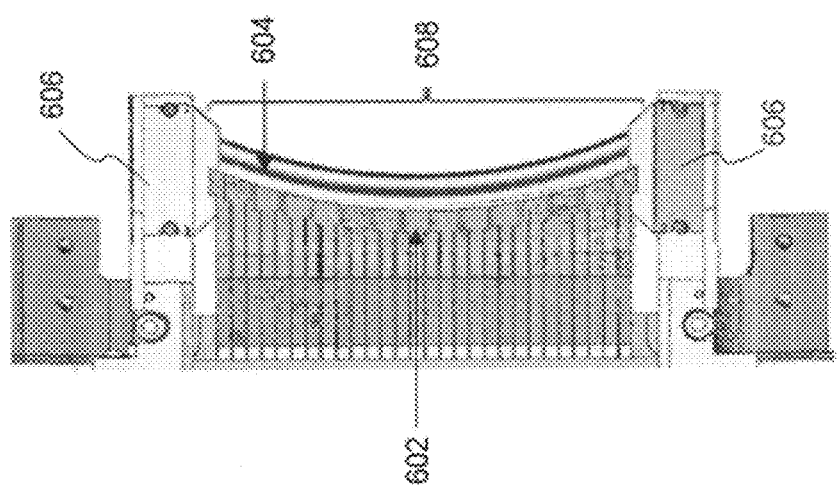

An example uniformity compensator is shown in more detail in FIGS. 6A and 6B. FIG. 6A shows an example, elevated view of the uniformity compensator system, looking downward from the reticle. FIG. 6A is similar to FIG. 3 and shows an example uniformity compensator with fingers 602 and energy sensors 606. By controlling the movement of the individual uniformity compensators 602 into and out of the beam 604, uniformity of the illumination slit 608 can be controlled.

A side view of the example uniformity compensator of FIG. 6A is shown in FIG. 6B. The uniformity compensator fingers that are illustrated in 602 in FIG. 6A are shown 602 in FIG. 6B. As shown in FIG. 6B, the uniformity compensating fingers are below the reticle 616 and are separated by a distance 610. The distance 610 between the fingertips and the reticle is on the order of several millimeters. In an example embodiment, the distance 610 may be between about 10-20 mm.

Incident and reflected beams illustrated in FIG. 6B are seen interacting with the fingers 602 and the reticle 616 making an angle with the reticle as shown in 614 and 620. The rest of the structure in FIG. 6B is associated with the actuators that control the movement of the fingers as will be discussed below.

A three-dimensional model of the uniformity compensator is shown in FIG. 7. The uniformity compensator fingers 602 can be seen. The fingertips 602, which extend into the beam can be moved into and out of the beam and are connected to finger necks 704. The measurement and control of the movement of the fingers is controlled by an encoder box 706. Exemplary mounting hardware is illustrated at 708.

Figure 8:
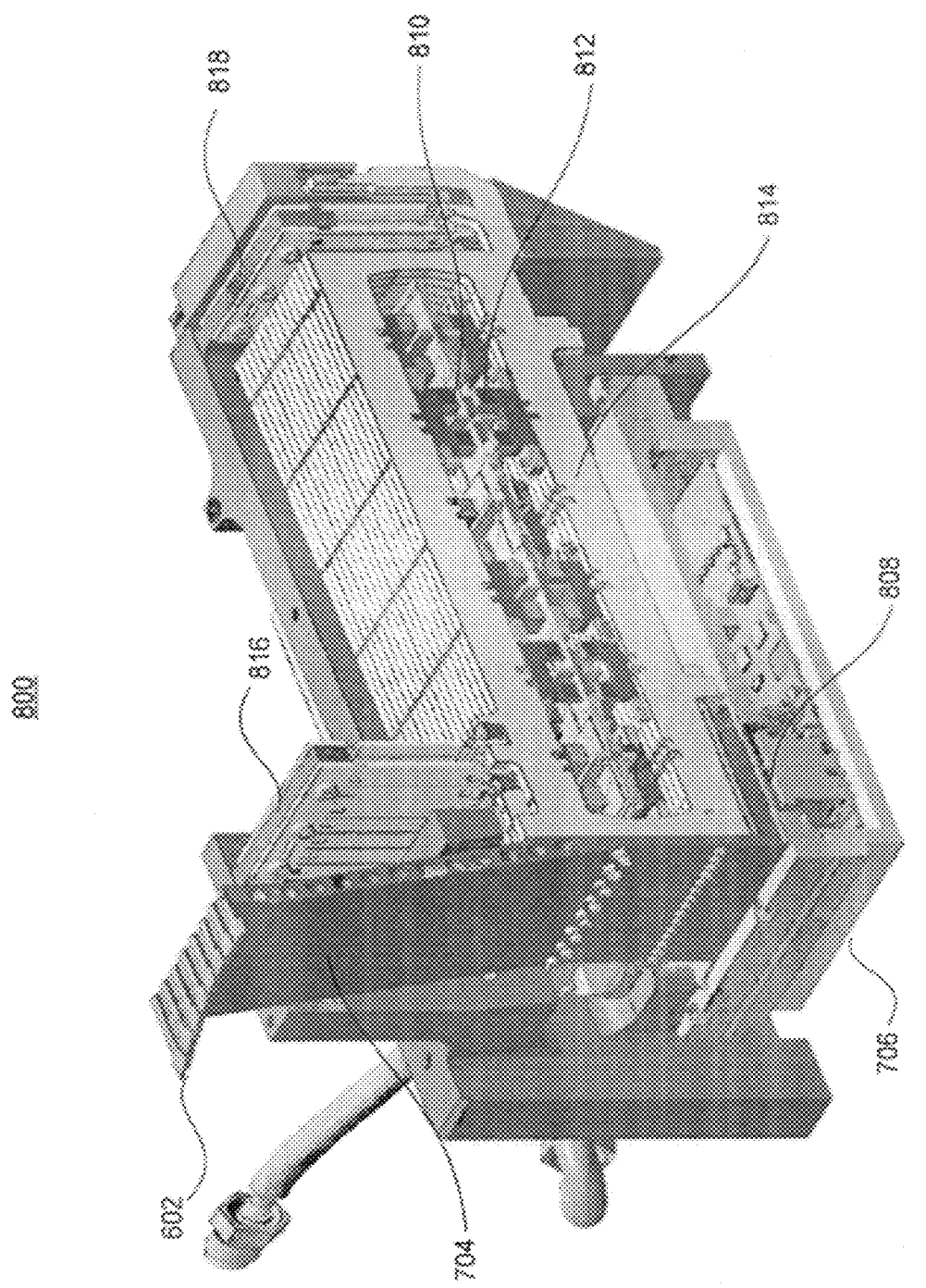
FIG. 8 is a cut-away illustration of a mechanism that controls the movement of fingers in an example uniformity compensator.

FIG. 8 is a cut-away illustration of the encoder box 706. As before, the fingertips 602 that move into and out of the beam are connected to finger necks 704. The control circuitry is housed in the encoder box 706 as well as a measurement mechanism 808 that measures the displacement of the fingers. Each individual finger is moved (in a translational manner) by a linear motor 812 that utilizes magnets 810. This cut-away-illustration also shows a finger body 814 as well as flexures 816 and 818.

Figure 9A:
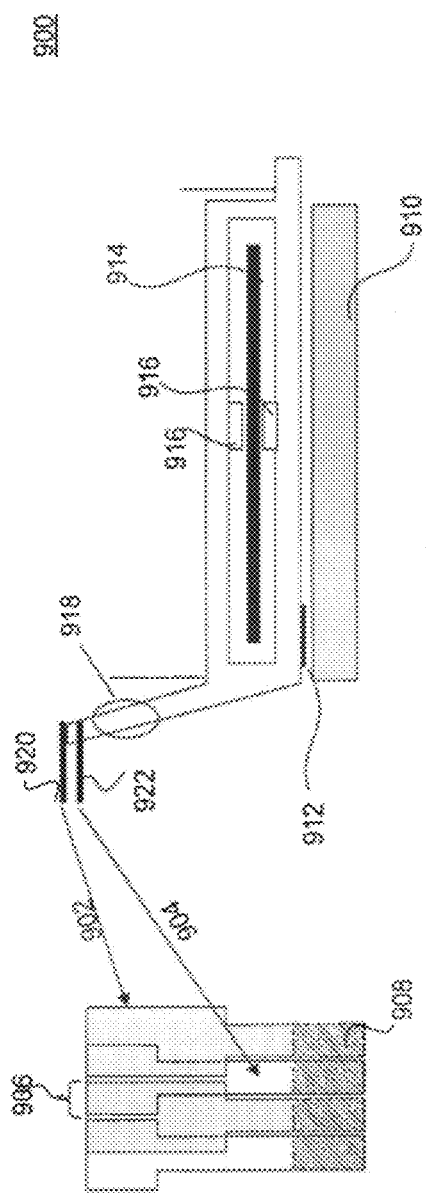
FIGS. 9A and 9B illustrate example uniformity compensators with overlapping fingers having 4 mm and 2 mm pitch respectively.

FIG. 9A illustrates a particular embodiment in which overlapping fingers gives rise to a predetermined finger pitch 906. The fingers 602 of FIG. 8 are shown in more detail as the features 902 and 904 in the left hand portion of FIG. 9A, which is a top down view of the fingers. This collection of overlapping fingertips is shown in more detail in FIGS. 10A and 10B. The right hand side of FIG. 9A is a schematic side view illustration corresponding to the cut-away structure of FIG. 8. In one embodiment, the predetermined finger pitch 906 is between 3-5 mm, and is preferably about 4 mm.

FIG. 10A shows a collection of overlapping fingertips corresponding to those on the left in FIG. 9A. The shape of the individual fingers are shown in FIG. 10B. FIG. 10B results from laterally separated the fingers of FIG. 10A. The fingertips are chosen in "T" shape shown in 10B so as to be overlapping, with the gray fingers on top of the white fingers. The width of the fingers 1008 and 1010 in this example embodiment is 7 mm. The pitch of this arrangement is 4 mm due to the overlapping placement as shown in FIG. 10A.

The detailed structure shown in the cut-away illustration of FIG. 8 has been abstracted on the right hand side in FIG. 9A. The finger necks 704 illustrated in FIG. 8 is shown schematically in 9A as feature 918 with the upper fingers 920 and lower finger 922 also schematically illustrated. The upper fingers 920 and lower fingers 922 on the right in FIG. 9 are overlapping as shown by respective grey 902 and white 904 fingers in the top-down view on the left of FIG. 9A.

The magnets 810 of FIG. 8 are abstracted as features 916 in FIG. 9A, together with other details of the linear motor 914 (812). The encoder box 706 of FIG. 8 is now abstracted as the gray rectangle 910 in FIG. 9A. This encoder box uses a measurement sensor 912 to measure the movement of the finger actuators. The encoder box 910 also contains the circuitry that controls the movement of the fingers.

The vertical finger necks 704 shown in FIG. 8 now appear as the shaded region 908 in the top down view on the left of FIG. 9A and as 918 in the side view on the right of FIG. 9A. The pitch 906 is determined as the distance between a right hand edge of one finger and a corresponding right hand edge of an adjacent finger. Although the width of a given finger in this example is 7 mm, because of the way that the fingers are overlapping, the pitch is smaller than that. In particular, in this case it is 4 mm.

Figure 9B:
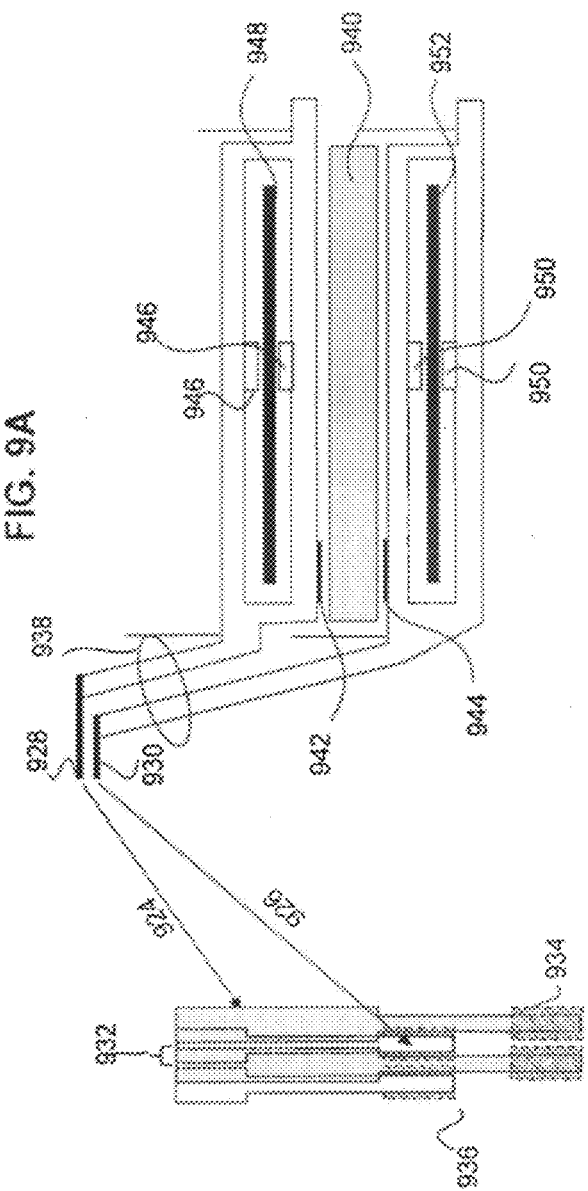

FIG. 9B shows another example embodiment in which two sets of fingers are displaced from one another. The embodiment of FIG. 9B is generated by arranging (or otherwise configuring) two sets of fingers and displacing them one from the other. Thus, in the illustration on the left in FIG. 9B, the gray fingers now correspond to all of the fingers that were illustrated in FIG. 9A. The white fingers correspond to the arrangement of fingers shown in 9A, after a lateral and vertical displacement as shown schematically on the right in FIG. 9B.

The upper set of fingers 928 in FIG. 9B is a copy of the complete set of fingers 920 and 922 of FIG. 9A. Likewise, the lower set of fingers 930 in FIG. 9B is a similar copy of the complete set of fingers 920 and 922 of FIG. 9A. As such, the example embodiment of FIG. 9B comprises twice as many fingers as that of FIG. 9A. Such an arrangement can be accomplished by using a double-sided encoder box 940. A motor mechanism for the top collection of fingers is shown in 948 with magnets 946. Likewise, a lower motor 952 and magnet assembly 950 for the lower collection of fingers are shown. In this embodiment, the double-sided encoder box uses one encoder 942 to encode the positions of the upper set of fingers and another encoder 944 to encode the positions lower set of fingers. The necks of the two collections of fingers are shown by 938 on the right and shaded regions 934 and 936 in the top down view on the left hand side if FIG. 9B.

In an example embodiment as shown in FIG. 9A, a set of 28 overlapping fingers each with finger width 7 mm resulting in a 4 mm pitch is provided. The corresponding embodiment of FIG. 9B comprises two sets of 28 fingers with each finger having width 3 mm. The second set can be displaced laterally by 2 mm such that the totality of 48 fingers has a pitch of 2 mm. In order for the configuration of FIG. 9B to be accommodated, the length of the fingers has to be different for the two sets of fingers 928 and 930 in FIG. 9B. This is illustrated in more detail in FIGS. 10A-D.

FIG. 10C illustrates the collection of overlapping fingers to achieve a 2 mm pitch. These comprise two overlapping sets of fingers. The fingers in FIG. 10C that are represented in gray, correspond to all of the fingers in 10A, but the width of the finger tips in FIGS. 10C and 10D is 3 mm. Likewise, the fingers that are illustrated as 1014 in white in FIG. 10C also correspond to a duplicate set of all of the fingers shown in 10A upon reduction of the width from 7 mm to 3 mm, for example. As mentioned previously, the two sets of fingers are displaced from one another by 2 mm.

Figure 11:
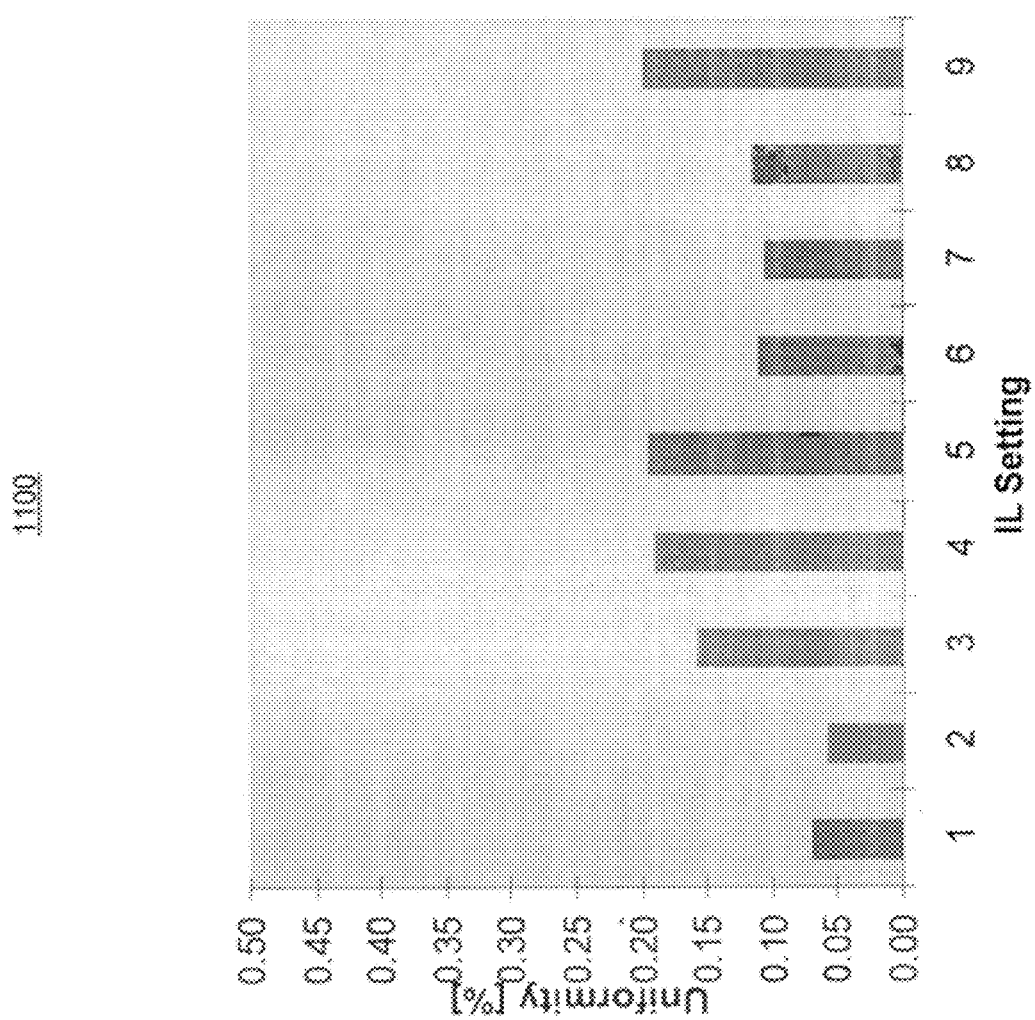
FIG. 11 shows uniformity error performance of an example embodiment uniformity compensation system with 4 mm pitch.
Figure 12:
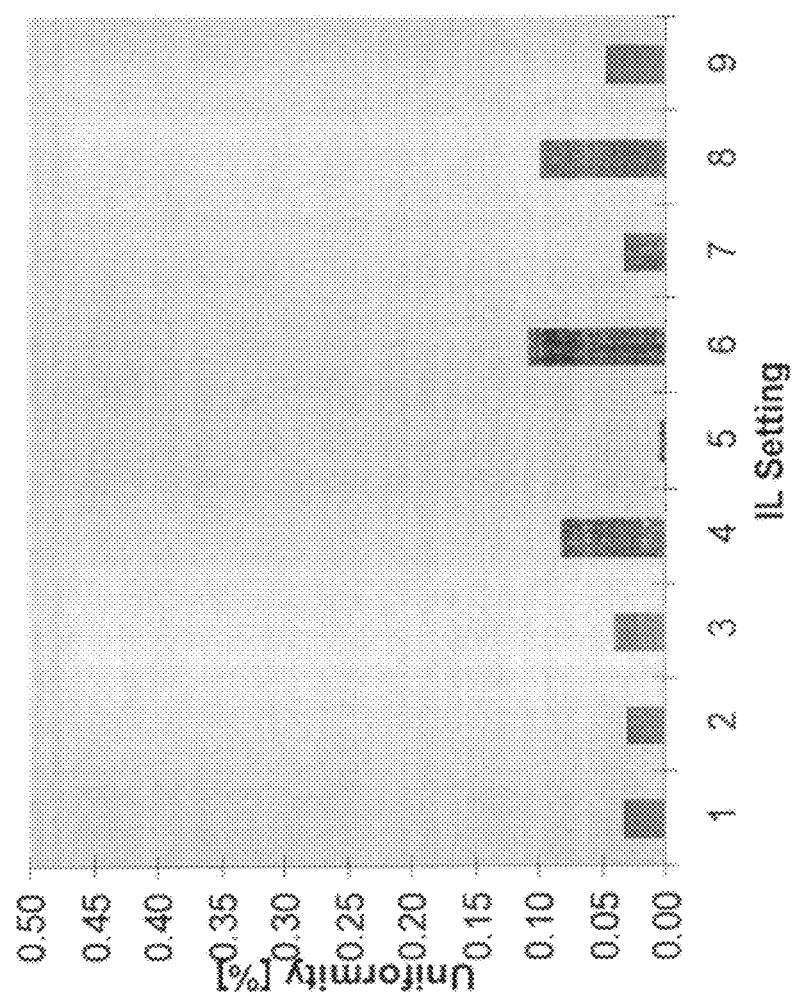
FIG. 12 shows uniformity error performance of an example embodiment uniformity compensation system with 2 mm pitch.

The performance of embodiments shown in FIGS. 9A and 9B in terms of correcting the uniformity of illumination of a beam is shown in FIGS. 11 and 12. Both FIGS. 11 and 12 plot the uniformity error for various types of illumination (1. quasi-cony; 2. large annular; 3. small annular; 4. dipole x 90; 5. dipole y 90; 6. quasar 45; 7. cquad 45; 8. dipole x 120; and 9. dipole y 120).

FIG. 11 corresponds to the embodiment of FIG. 9A with a 4 mm pitch while FIG. 12 illustrates the uniformity error for the embodiment of FIG. 9B that has 2 mm pitch.

The uniformity error is defined as the ratio between the difference of the maximum and minimum intensity, and the sum of the maximum and minimum intensity. Ideally, this ratio should be zero for a completely uniform beam. For non-uniform illumination, this ratio quantifies the performance of the uniformity compensators. This explains why FIGS. 11 and 12 show variations for different illuminations. FIG. 12 is the measured uniformity error for the same sets of illumination patterns using the configuration of FIG. 9B. Clearly the embodiment of FIG. 9B, with 2 mm pitch shows improved uniformity performance as shown in FIG. 12 relative to the embodiment of FIG. 9A with 4 mm pitch as shown in FIG. 11. This is because the smaller pitch of the embodiment of FIG. 9B provides for the ability to correct illumination variations with higher spatial frequency.

Figure 13:
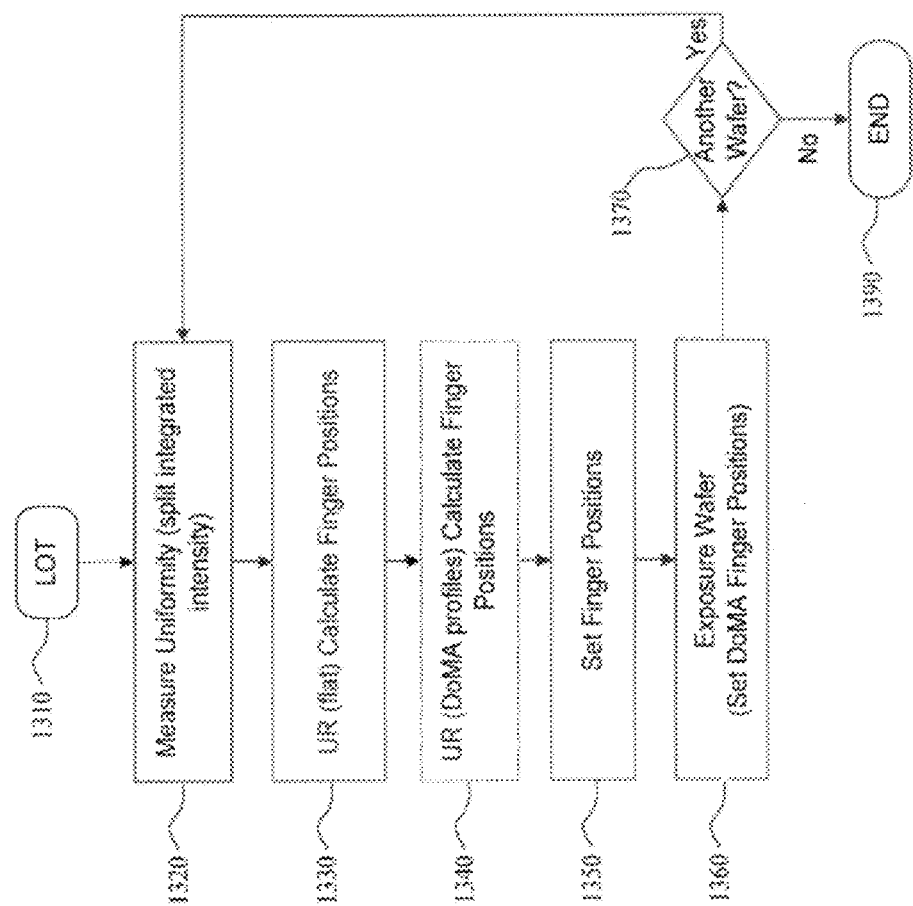
FIG. 13 shows a flow for uniformity refresh.

FIG. 13 illustrates a method, according to an embodiment of the present invention for compensating for system uniformity drift. Such a method can be used to maximize manufacturing efficiencies by improving the quantity of successfully imaged devices on a substrate to substrate basis.

In one example, method starts at a beginning of each lot 1310 of substrates. In step 1320, the illumination slit uniformity is measured (e.g., by slit integrated intensity or by slit-scan average using discrete intensity samples along the slit). In step 1320, the uniformity refresh (UR) correction system calculates uniformity compensators (e.g., fingers) positions based on a flat intensity profile across the slit. Optionally, in step 1340 the uniformity refresh (UR) correction system calculates uniformity compensators (e.g., fingers) positions based on a non-flat intensity profile (using a system such as DOSEMAPPER® or DoMa manufactured by ASML, Veldhoven, The Netherlands). Examples regarding DOSEMAPPER® embodiments may be found in U.S. Pat. No. 7,532,308, issued May 12, 2009, which is incorporated herein by reference in its entirety. In step 1350, the uniformity refresh (UR) correction system sets positions of the plurality of uniformity compensators (e.g., fingers). In step 1360, a substrate is exposed. In one example, during the exposure of each substrate, a number of different non-flat profiles (e.g., DOSEMAPPER® target illumination slit profiles) may be used (e.g., depending on the portion of the substrate being exposed). Thus, there may be uniformity compensator finger position changes even during the exposure of a single substrate. In step 1370, it is determined whether or not another substrate is to be exposed in the lot. If step 1370 returns "yes," the method returns to step 1320. If step 1370 returns "no", more substrates in the lot are to be exposed, at step 1390 method ends.

In an embodiment of the present invention, during step 1310 the illumination slit uniformity is controlled (e.g., corrected) between subsequent substrates of a single lot, so that each substrate in the lot is exposed with an independently controlled uniform illumination slit. In step 1320, a uniformity of the illumination slit is measured. For example, the uniformity of the illumination slit may change due to a number of factors, for example illumination beam movement, optical column uniformity, or uniformity compensator finger drift.

In one example, the uniformity of the illumination slit is measured as a continuous intensity profile by integrating the illumination slit intensity across the entire slit. Additionally, or alternatively, the uniformity of the illumination slit may be measured as a slit-scan averaged intensity using discrete intensity samples along the slit.

In step 1330, using the measured illumination slit uniformity from step 1320, the finger positions are calculated so as to produce a flat target illumination slit uniformity. Optionally, in step 1340, non-flat (DoMa) uniformity profiles can be used, along with the measured illumination slit uniformity from step 1320, to calculate the finger positions. In step 1350, the calculated finger positions are set so that the illumination beam uniformity matches either the flat target profile or the non-flat target profile. In step 1360, a substrate is exposed.

In one embodiment, the fingers are moved during the exposure of the substrate so that different portions of the substrate are exposed using different illumination slit target profiles.

In step 1370, it is determined whether there are additional substrates in the lot to be exposed. If step 1370 returns yes, then method returns to step 1320. In one example, measuring and correcting the uniformity of the illumination slit between substrates of a single lot is desirable because system movement, heat generation, and vibrations may have caused the uniformity of the illumination slit to change. If step 1370 returns no, method ends at step 1390.

Figure 14:
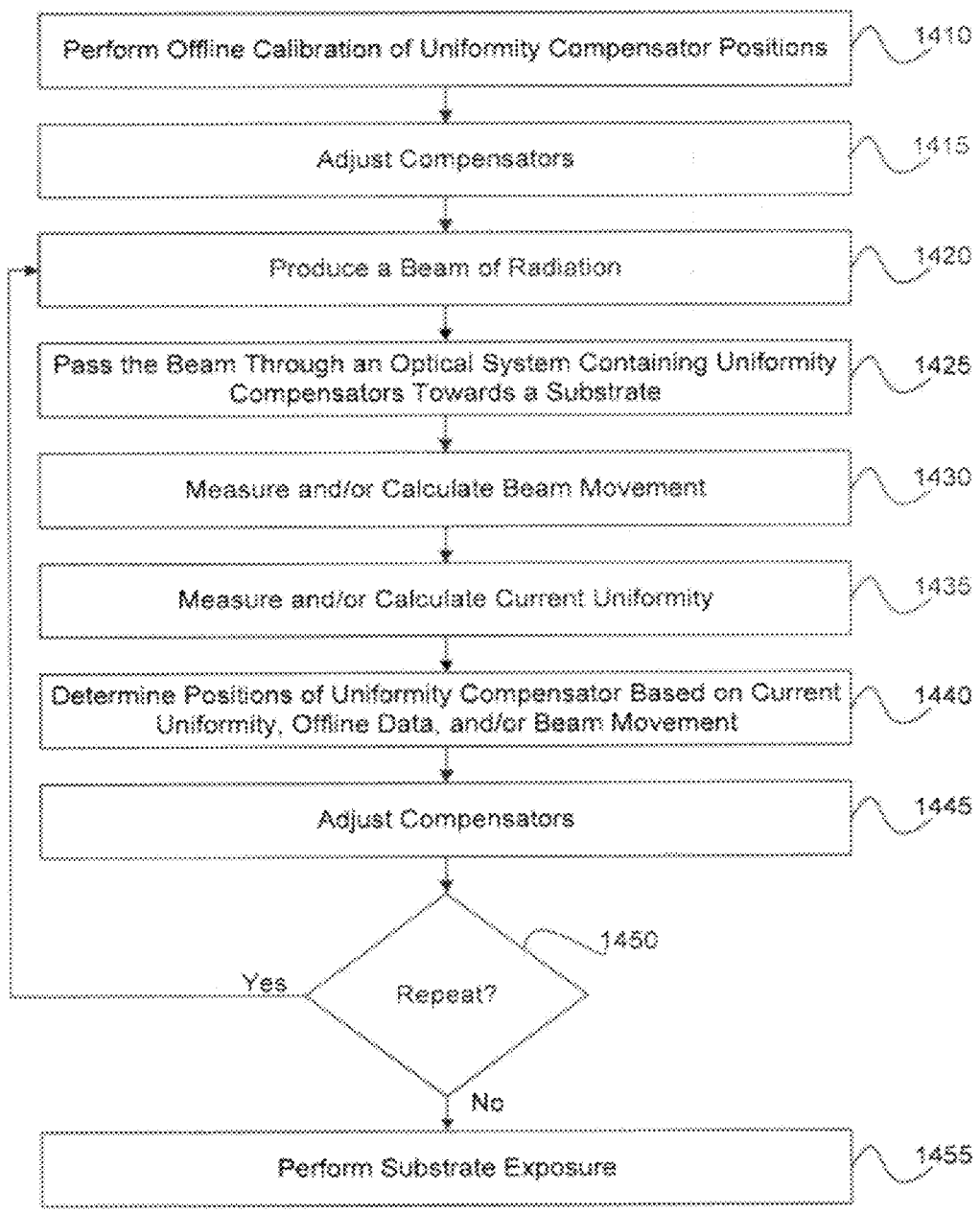
FIG. 14 depicts generalized main flow that is the combination of uniformity refresh and (optionally) offline calibration.

FIG. 14 illustrates a method, according to an embodiment of the present invention for compensating for system uniformity drift. For example, this method can be used to maximize manufacturing efficiencies by improving the quantity of successfully imaged devices on a substrate to substrate basis. Method shown in FIG. 14 can include an initial calibration step before a first substrate is processed. Subsequent substrates may not have a calibration step, but rather use the prior substrates ending measurement values as the initial measurement values.

In step 1410, an offline calibration of uniformity compensator positions is performed. In step 1415, the uniformity compensators are mechanically adjusted. In step 1420, a beam of radiation is produced. In step 1425, the beam of radiation is passed through an optical system containing the uniformity compensators. In optional step 1430, the beam movement is measured or beam movement is calculated. In step 1435, the illumination slit uniformity is measured or calculated (e.g., if measured, this can be by slit integrated intensity or it can be by slit-scan average using discrete intensity samples along the slit). In step 1440, positions of the uniformity compensator (e.g., finger) are determined based on current uniformity, offline data, and/or beam movement. In step 1445, the uniformity compensator (e.g., finger) positions are adjusted. In step 1450, a determination is made whether method shown in FIG. 13 should be performed again. If step 1450 returns "yes," method shown in FIG. 14 returns to step 1420. If step 1450 returns "no," the method shown in FIG. 14 moves to step 1455, during which a substrate is exposed.

In one example, during the exposure of each substrate, a number of different non-flat profiles (e.g., DOSEMAPPER® target illumination slit profiles) may be used depending on the portion of the substrate being exposed. For example, there may be uniformity compensator finger position changes even during the exposure of a single substrate. Examples regarding modeling of uniformity changes during heating and cooling cycles, calibrating associated parameters, and applying these results to actuation of individual attenuators may be found in U.S. Pat. No. 7,532,308, issued May 12, 2009, and U.S. Pat. No. 6,455,862, issued Sep. 24, 2002, both of which are incorporated herein by reference in their entireties.

In an embodiment of the present invention, the illumination slit uniformity is controlled (e.g., corrected) between subsequent substrates as described with reference to FIG. 13. Also, in an embodiment of the present invention, the method for adjusting the uniformity compensators so that the illumination slit uniformity matches a target illumination slit uniformity comprises at least two measurements of the illumination slit uniformity per substrate. That is, when method shown in FIG. 14 reaches step 1450 a "repeat" decision is made. The "repeat" decision is usually "yes" the first time for each substrate. When decision 1450 is "yes," step 1420 is repeated and a new beam of radiation is produced. The new beam of radiation is passed, in step 1435, through the optical system. Step 1435 measures the illumination slit uniformity, step 1440 determines the uniformity compensator positions, and step 1445 adjusts the uniformity compensators.

During the repetition of method shown in FIG. 14, if the measured illumination slit uniformity is within a pre-determined tolerance of a target illumination slit intensity profile (flat or non-flat), than there will be no further need to repeat the compensating method and "no" will be chosen at step 1450. Thereafter, at step 1455, exposure of a substrate may occur as described with reference to FIG. 13. Method shown in FIG. 14 may also be performed without a comparison to a pre-determined tolerance. In an embodiment, method shown in FIG. 14 is performed only once and does not repeat to determine if the uniformity compensator adjustments, in step 1445, cause the illumination slit uniformity to match the target illumination slit intensity profile (flat or non-flat).

In another example, if the measured illumination slit uniformity is not within a pre-determined tolerance of a target illumination slit intensity profile (flat or non-flat), then the uniformity compensators may need further adjustment. In this case, "yes" will be chosen again at step 1450. The illumination slit uniformity can be fine-tuned to be closer to the target illumination slit intensity profile. Alternatively, there may be no need to repeat the method, even after the first time for a substrate, if the measured illumination slit uniformity is within a pre-determined tolerance of a target illumination slit intensity profile.

Figure 15:
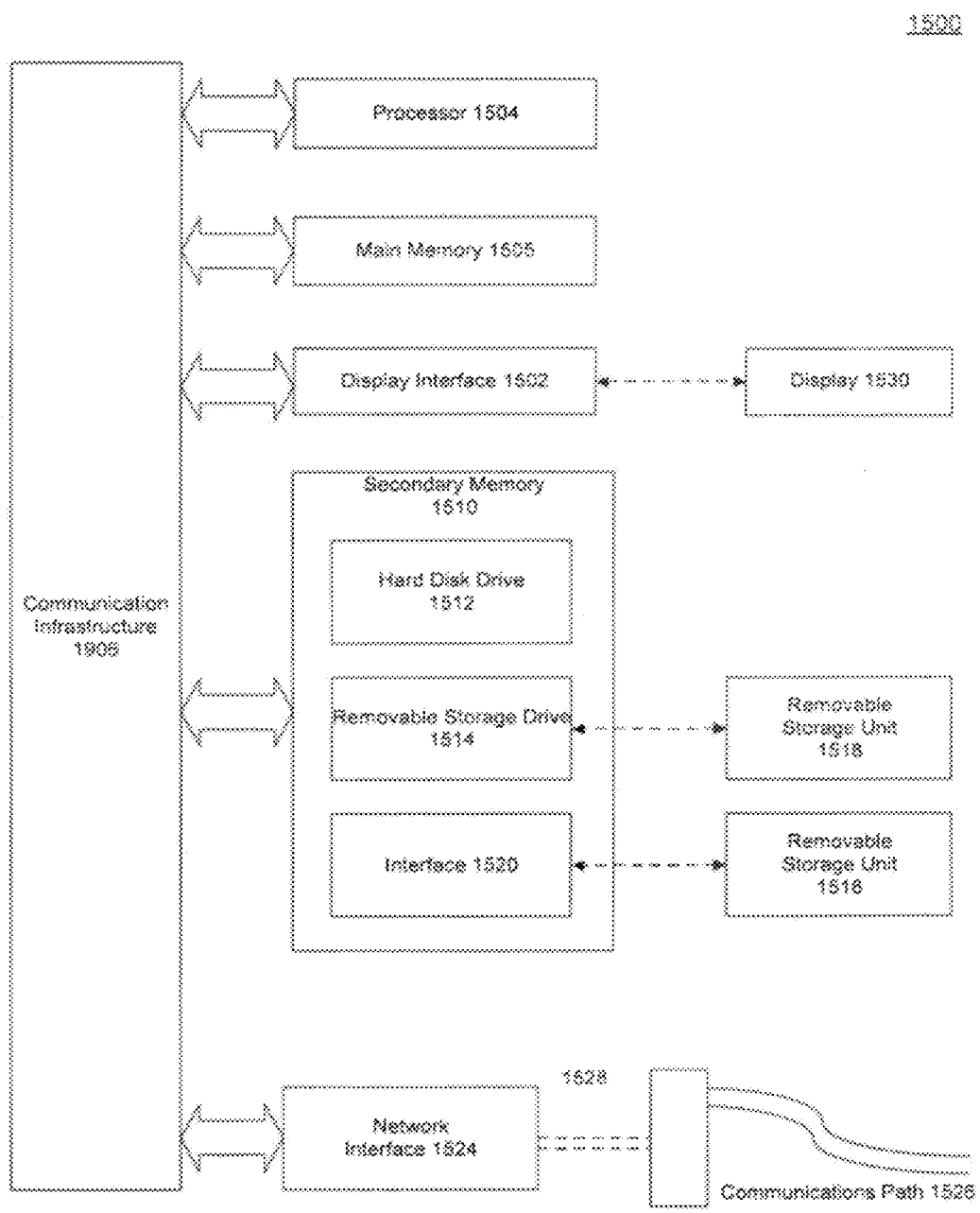
FIG. 15 is an illustration of an example computer system 1500 in which embodiments of the present invention, or portions thereof, can be implemented as computer-readable code.

The control methods of the present invention illustrated in FIGS. 13 and 14 may be implemented in software, firmware, hardware, or a combination thereof. FIG. 15 is an illustration of an example computer system 1500 in which embodiments of the present invention, or portions thereof, can be implemented as computer-readable code. The methods illustrated by flowcharts of FIGS. 13 and 14, can be implemented in computer system 1500 that includes a display interface 1502 coupled to a display 1530. Various embodiments of the invention are described in terms of this example computer system 1500. After reading this description, it will become apparent to a person skilled in the relevant art how to implement embodiments of the invention using other computer systems and/or computer architectures.

Computer system 1500 includes one or more processors, such as processor 1504. Processor 1504 may be a special purpose or a general purpose processor. Processor 1504 is connected to a communication infrastructure 1506 (e.g., a bus or network).

Computer system 1500 also includes a main memory 1505, preferably random access memory (RAM), and may also include a secondary memory 1510. Secondary memory 1510 can include, for example, a hard disk drive 1512, a removable storage drive 1514, and/or a memory stick. Removable storage drive 1514 can comprise a floppy disk drive, a magnetic tape drive, an optical disk drive, a flash memory, or the like. The removable storage drive 1514 reads from and/or writes to a removable storage unit 1518 in a well-known manner. Removable storage unit 1518 can include a floppy disk, magnetic tape, optical disk, etc. which is read by and written to by removable storage drive 1514. As will be appreciated by persons skilled in the relevant art, removable storage unit 1518 includes a computer-usable storage medium having stored therein computer software and/or data.

In alternative implementations, secondary memory 1510 can include other similar devices for allowing computer programs or other instructions to be loaded into computer system 1500. Such devices can include, for example, a removable storage unit 1518 and an interface 1520. Examples of such devices can include a program cartridge and cartridge interface (such as those found in video game devices), a removable memory chip (e.g., EPROM or PROM) and associated socket, and other removable storage units 1518 and interfaces 1520 which allow software and data to be transferred from the removable storage unit 1518 to computer system 1500.

Computer system 1500 can also include a communications interface 1524. Communications interface 1524 allows software and data to be transferred between computer system 1500 and external devices. Communications interface 1524 can include a modem, a network interface (such as an Ethernet card), a communications port, a PCMCIA slot and card, or the like. Software and data transferred via communications interface 1524 are in the form of signals, which may be electronic, electromagnetic, optical, or other signals capable of being received by communications interface 1524. These signals are provided to communications interface 1524 via a communications path 1526 and 1528. Communications path 1526 and 1528 carries signals and may be implemented using wire or cable, fiber optics, a phone line, a cellular phone link, a RF link or other communications channels.

In this document, the terms "computer program medium" and "computer-usable medium" are used to generally refer to media such as removable storage unit 1518, removable storage unit 1518, and a hard disk installed in hard disk drive 1512. Computer program medium and computer-usable medium can also refer to memories, such as main memory 1505 and secondary memory 1510, which can be memory semiconductors (e.g., DRAMs, etc.). These computer program products provide software to computer system 1500.

Computer programs (also called computer control logic) are stored in main memory 1505 and/or secondary memory 1510. Computer programs may also be received via communications interface 1524. Such computer programs, when executed, enable computer system 1500 to implement embodiments of the present invention as discussed herein. In particular, the computer programs, when executed, enable processor 1504 to implement processes of the present invention, such as the steps in the methods illustrated by flowchart of FIG. 13, discussed above. Accordingly, such computer programs represent controllers of the computer system 1500. Where embodiments of the invention are implemented using software, the software can be stored in a computer program product and loaded into computer system 1500 using removable storage drive 1514, interface 1520, hard drive 1512 or communications interface 1524.

Embodiments of the invention are also directed to computer program products including software stored on any computer-usable medium. Such software, when executed in one or more data processing device, causes a data processing device(s) to operate as described herein. Embodiments of the invention employ any computer-usable or -readable medium, known now or in the future. Examples of computer-usable mediums include, but are not limited to, primary storage devices (e.g., any type of random access memory), secondary storage devices (e.g., hard drives, floppy disks, CD ROMS, ZIP disks, tapes, magnetic storage devices, optical storage devices, MEMS, nanotechnological storage devices, etc.), and communication mediums (e.g., wired and wireless communications networks, local area networks, wide area networks, intranets, etc.).

CONCLUSION

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The claims in the instant application are different than those of the parent application or other related applications. The Applicant therefore rescinds any disclaimer of claim scope made in the parent application or any predecessor application in relation to the instant application. The Examiner is therefore advised that any such previous disclaimer and the cited references that it was made to avoid, may need to be revisited. Further, the Examiner is also reminded that any disclaimer made in the instant application should not be read into or against the parent application.

What is claimed is:

1. A lithographic apparatus comprising:
an illumination system configured to condition a beam of radiation, the illumination system comprising a uniformity correction system, the uniformity correction system including:
fingers configured to be movable into and out of an intersection with the radiation beam so as to correct an intensity of respective portions of the radiation beam, and
actuating devices coupled to corresponding ones of the fingers and configured to move the corresponding fingers,
wherein a width of a tip of each of the fingers is larger than that of a width of the actuating devices, the fingers are arranged in first and second groups in respective first and second planes that are separated from each other along a direction perpendicular to the planes, and the width of the tip of each finger is larger than a spacing between the fingers so that adjacent fingers overlap;
a support structure configured to hold a patterning device, the patterning device configured to pattern the conditioned beam of radiation;
a substrate table configured to hold a substrate; and
a projection system configured to project the patterned radiation beam onto a target portion of the substrate.

2. The lithographic apparatus of claim 1, wherein a minimum spatial period of intensity variation of the beam of radiation corrected by the fingers is smaller than the width of the tip of each finger.

3. The lithographic apparatus of claim 1, wherein the minimum spatial period of intensity variation of the beam of radiation is about half of the width of the tip of each finger.

4. The lithographic apparatus of claim 1, wherein the width of the tip of each finger is about 7 mm and a minimum spatial period of intensity variation of radiation is about 4 mm.

5. The lithographic apparatus of claim 1, wherein the fingers are further arranged in third and fourth groups in respective third and fourth planes that are separated from one another along a direction perpendicular to the planes, and wherein the width of each finger is larger than a spacing between the fingers so that adjacent fingers overlap.

6. The lithographic apparatus of claim 5, wherein a minimum spatial period of intensity variation of the beam of radiation corrected by the fingers is smaller than the width of the tip of each finger.

7. The lithographic apparatus of claim 5, wherein a minimum spatial period of intensity variation of radiation is about half the width of the tip of each finger.

8. The lithographic apparatus of claim 5, wherein the width of the tip of each finger is about 3 mm and a minimum spatial period of intensity variation of radiation is about 2 mm.

9. A device manufacturing method comprising:
focusing a beam of radiation at a first plane;
adjusting an intensity of the beam of radiation near the first plane by moving fingers located near the first plane into and out of a path of the beam of radiation,
wherein a width of a tip of each of the fingers is larger than that of corresponding actuating devices used to move each corresponding one of the fingers, the fingers are arranged in first and second groups in respective first and second planes that are separated from each other along a direction perpendicular to the planes, and the width of the tip of each finger is larger than a spacing between the fingers so that adjacent fingers overlap;
directing the beam of radiation beam onto a patterning device to pattern the beam of radiation; and
projecting the patterned radiation beam onto a substrate.

10. The method of claim 9, wherein a minimum spatial period of intensity variation of the beam of radiation corrected by the fingers is smaller than the width of the tip of each finger.

11. The method of claim 9, wherein a minimum spatial period of intensity variation of the beam of radiation is about half of the width of the tip of each finger.

12. The method of claim 9, wherein the width of the tip of each finger is about 7 mm and a minimum spatial period of intensity variation of the beam of radiation is about 4 mm.

13. The method of claim 9, wherein the fingers are further arranged in third and fourth groups in respective third and fourth planes that are separated from one another along a direction perpendicular to the planes, and wherein the width of the tip of each finger is larger than a spacing between the fingers so that adjacent fingers overlap.

14. A uniformity correction system, comprising:
fingers configured to be movable into and out of an intersection with a radiation beam so as to correct an intensity of respective portions of the radiation beam, and
actuating devices coupled to corresponding ones of the fingers and configured to move the corresponding fingers,
wherein a width of a tip of each of the fingers is larger than that of a width of the actuating devices, the fingers are arranged in first and second groups in respective first and second planes that are separated from each other along a direction perpendicular to the planes, and the width of each finger is larger than a spacing between the fingers so that adjacent fingers overlap.

15. A method comprising:
providing fingers located at a first plane; and
providing actuating devices coupled to corresponding ones of the fingers that adjust an intensity of a beam of radiation at the first plane by moving the fingers located at the first plane into and out of a path of the beam of radiation,
wherein a width of a tip of each of the fingers is larger than a width of corresponding ones of the actuating devices used to move each of the corresponding one's of the fingers, the fingers are arranged in first and second groups in respective first and second planes that are separated from each other along a direction perpendicular to the planes, and the width of tip of each finger is larger than a spacing between the fingers so that adjacent fingers overlap.

16. The method of claim 15, wherein the fingers are further arranged in third and fourth groups in respective third and fourth planes that are separated from one another along a direction perpendicular to the planes, and wherein the width of the tip of each finger is larger than a spacing the between fingers so that adjacent fingers overlap.

17. The lithographic apparatus of claim 1, wherein a length of the first group of fingers is different than a length of the second group of fingers.

18. The method of claim 9, wherein a length of the first group of fingers is different than a length of the second group of fingers.

* * * * *